US011183673B2

(12) United States Patent
Park et al.

(10) Patent No.: US 11,183,673 B2
(45) Date of Patent: Nov. 23, 2021

(54) DISPLAY DEVICE AND A METHOD FOR MANUFACTURING THE SAME

(71) Applicant: Samsung Display Co., Ltd., Yongin-si (KR)

(72) Inventors: Yongjun Park, Yongin-si (KR); Sunghoon Yang, Seoul (KR); Seyoon Oh, Yongin-si (KR); Jongmin Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 52 days.

(21) Appl. No.: 16/593,191

(22) Filed: Oct. 4, 2019

(65) Prior Publication Data
US 2020/0168850 A1 May 28, 2020

(30) Foreign Application Priority Data
Nov. 22, 2018 (KR) .................. 10-2018-0145368

(51) Int. Cl.
*H01L 51/56* (2006.01)
*H01L 51/00* (2006.01)
*H01L 51/52* (2006.01)
*H01L 27/32* (2006.01)

(52) U.S. Cl.
CPC .......... *H01L 51/56* (2013.01); *H01L 51/0097* (2013.01); *H01L 51/5271* (2013.01); *H01L 27/3244* (2013.01)

(58) Field of Classification Search
CPC ............. H01L 27/3223; H01L 27/3225; H01L 27/3234; B23K 26/0661; B23K 26/0643
See application file for complete search history.

(56) References Cited

U.S. PATENT DOCUMENTS

| 10,135,010 | B2 | 11/2018 | Kim et al. |
| 2008/0087629 | A1 | 4/2008 | Shimomura et al. |
| 2009/0020511 | A1* | 1/2009 | Kommera .......... B23K 26/0622 219/121.68 |
| 2017/0287992 | A1* | 10/2017 | Kwak ................. H01L 27/3234 |
| 2018/0151834 | A1 | 5/2018 | Kanaya |
| 2018/0161938 | A1 | 6/2018 | Cathry et al. |
| 2018/0183015 | A1 | 6/2018 | Yun et al. |
| 2018/0374985 | A1* | 12/2018 | Chen ....................... H01L 33/10 |
| 2019/0051859 | A1* | 2/2019 | Choi ................... H01L 51/0097 |

(Continued)

FOREIGN PATENT DOCUMENTS

| JP | 2006286493 | 10/2006 |
| KR | 10-1397108 | 5/2014 |

(Continued)

OTHER PUBLICATIONS

European Examination Report issued in corresponding European Patent Application No. 19210981.7 dated May 12, 2020.

*Primary Examiner* — Raj R Gupta
(74) *Attorney, Agent, or Firm* — F. Chau & Associates, LLC

(57) ABSTRACT

A display device including: a display panel; a polarization film disposed on the display panel; and a reflective layer disposed on the polarization film, wherein the reflective layer is disposed between a first hole and a first groove, wherein the first hole passes through the display panel and the polarization film, and the first groove is provided in the display panel around the first hole.

26 Claims, 23 Drawing Sheets

(56) References Cited

U.S. PATENT DOCUMENTS

2019/0245159 A1  8/2019 Kim et al.
2020/0127231 A1* 4/2020 Yun .................... H01L 51/5253

FOREIGN PATENT DOCUMENTS

| KR | 10-2017-0025942 | 3/2017 |
| KR | 10-2017-0045459 | 4/2017 |
| KR | 10-2017-0059864 | 5/2017 |
| KR | 10-2019-0094269 | 8/2019 |

* cited by examiner

DISPLAY DEVICE AND A METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2018-0145368, filed on Nov. 22, 2018, the disclosure of which is incorporated by reference herein in its entirety.

TECHNICAL FIELD

The present inventive concept relates to a display device and a method for manufacturing the same.

DISCUSSION OF RELATED ART

In general, electronic devices, such as smartphones, digital cameras, laptop computers, navigation units, and smart televisions, include a display device for displaying images to a user. The display device generates an image and provides a user with the generated image through a display screen.

The display device includes a display panel for generating an image and functional elements for providing the user with various functions. The functional elements include a speaker, a camera, and a functional button, etc. A plurality of holes are provided on the display panel, and the functional elements are disposed in the holes. The holes are made by removing cut regions from the display panel while manufacturing the display device.

A laser having a predetermined wavelength is irradiated to a boundary (hereinafter referred to as a cut line) of each of the cut regions to cut the cut regions. However, if the laser vibrates, the cut line may not be accurately cut.

SUMMARY

An exemplary embodiment of the inventive concept provides a display device including a display panel; a polarization film disposed on the display panel; and a reflective layer disposed on the polarization film, wherein the reflective layer is disposed between a first hole and a first groove, wherein the first hole passes through the display panel and the polarization film, and the first groove is provided in the display panel around the first hole.

In an exemplary embodiment of the inventive concept, a method for manufacturing a display device includes: receiving a display panel which comprises a closed-curve cut line and a groove around the cut line; disposing a polarization film on the display panel to cover the groove; disposing a reflective layer on the polarization film between the cut line and the groove; and irradiating a laser toward the cut line to cut a region of the display panel.

In an exemplary embodiment of the inventive concept, a display device includes: a display panel; a polarization film disposed on the display panel; a functional element disposed in a hole passing through the display panel and the polarization film; and a light absorbing layer disposed on the polarization film between the hole and a groove in the display panel, wherein the polarization film covers the groove and the groove surrounds the hole.

In an exemplary embodiment of the inventive concept, a display device includes: a display panel; a polarization film disposed on the display panel; a functional element disposed in a hole formed in the display panel and the polarization film; and a reflective layer disposed on the polarization film, wherein the reflective layer is disposed between the functional element and a groove formed in the display panel.

BRIEF DESCRIPTION OF THE FIGURES

Exemplary embodiments of the inventive concept will be more clearly understood from the following detailed description taken in conjunction with the accompanying drawings. In the drawings.

DETAILED DESCRIPTION OF THE EMBODIMENTS

In this specification, when an element (or region, layer, portion, etc.) is referred to as being "on", "connected to" or "coupled to" another element, it may be directly on, connected or coupled to the other element or a third element may be interposed therebetween.

In the figures, like reference numbers may refer to like elements. In addition, in the figures, the dimensions of layers and regions may be exaggerated for clarity of illustration.

Hereinafter, exemplary embodiments of the inventive concept will be described in detail with reference to the accompanying drawings.

Figure 1:
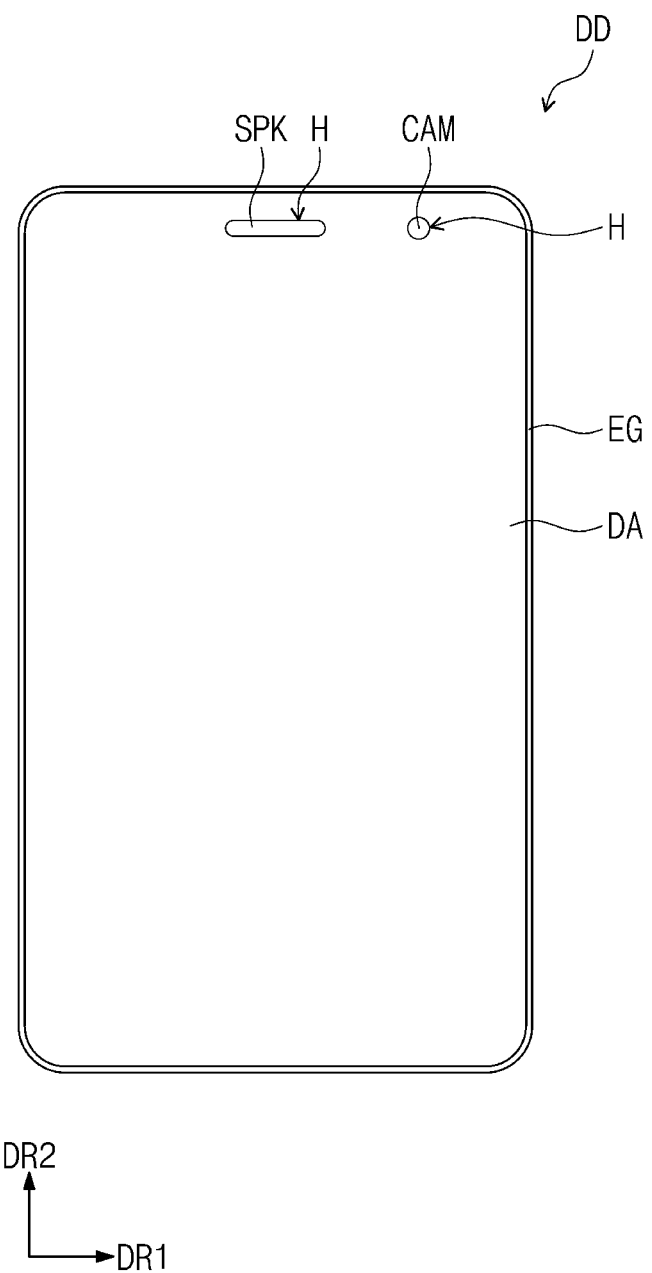
FIG. 1 is a plan view of a display device according to an exemplary embodiment of the inventive concept.

FIG. 1 is a plan view illustrating a display device according to an exemplary embodiment of the inventive concept.

Referring to FIG. 1, a display device DD may include a display region DA and an edge part EG which surrounds the display region DA and forms a boundary of the display device DD. The display region DA may have a plane extended in a first direction DR1 and a second direction DR2 crossing the first direction DR1.

The display device DD may include functional elements SPK and CAM which are disposed in a plurality of holes H in the display device DD. The functional elements SPK and CAM may include a speaker SPK and a camera CAM. However, the inventive concept is not limited thereto, and various functional elements (for example, sensors and functional buttons) may be disposed in additional holes H.

FIG. 1 illustrates that the display device DD is a mobile phone. However, the display device DD may be used for large-sized electronic devices such as televisions, and external advertisement boards, and also for small and medium-sized electronic devices such as personal computers, laptop computers, car navigation systems, game machines, and tablets. It is to be understood that these electronic devices are provided merely as examples, and thus, the display device DD may also be used for other electronic devices.

Figure 2:
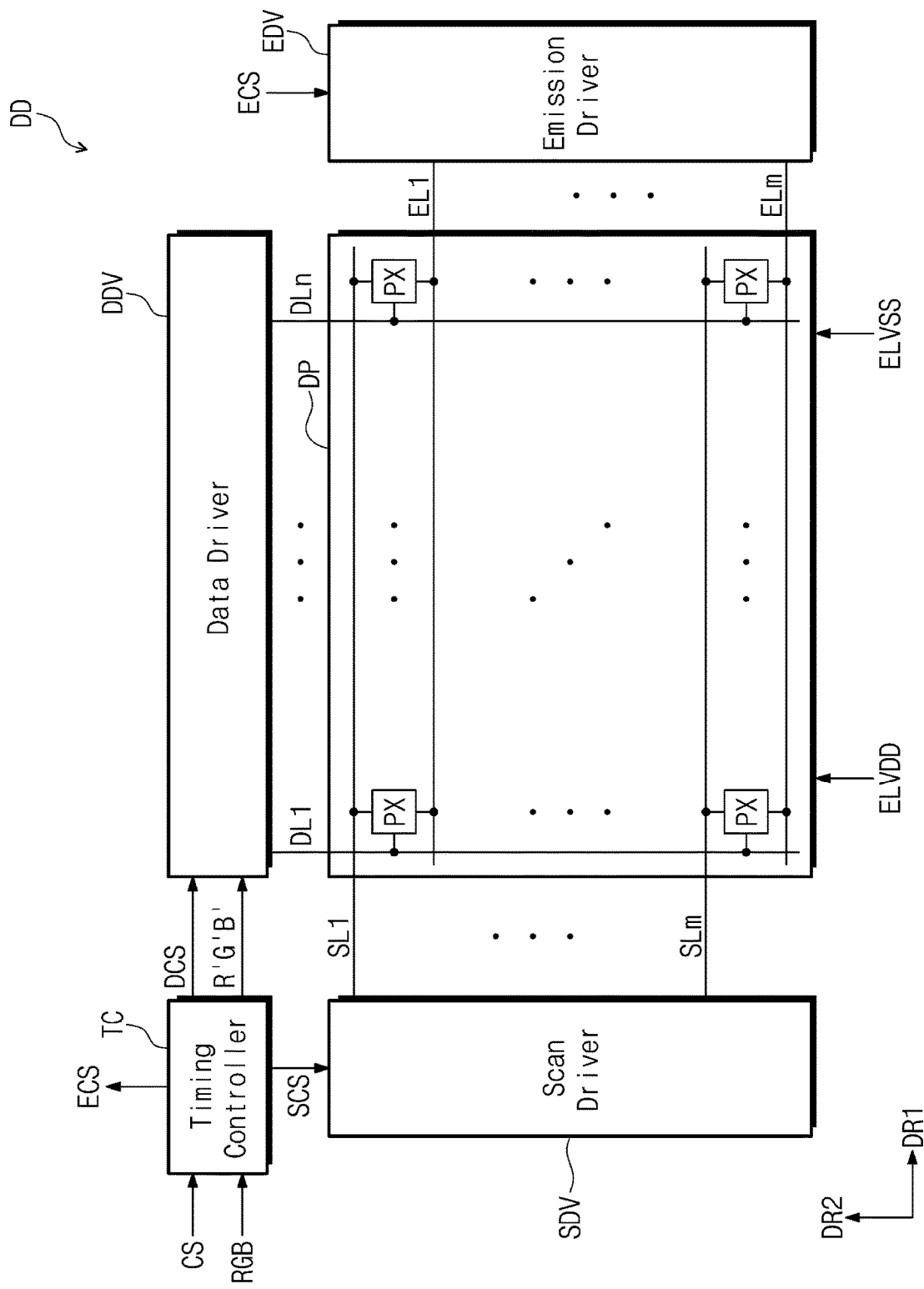
FIG. 2 is a block diagram of the display device illustrated in FIG. 1.

FIG. 2 is a block diagram of the display device DD illustrated in FIG. 1.

Referring to FIG. 2, the display device DD may include a display panel DP, a scan driver SDV, a data driver DDV, an emission driver EDV, and a timing controller TC. The display panel DP may be an organic light-emitting display panel, but the inventive concept is not limited thereto, and various display panels, such as a liquid crystal display panel, an electrowetting display panel, and an electrophoresis display panel may be used as the display panel DP.

The display panel DP may be a flexible display panel. The display panel DP may have a plane extended in the first direction DR and the second direction DR2. The display panel DP may overlap the display region DA illustrated in FIG. 1. The display region DA may be a display region of the display panel DP. The edge part EG illustrated in FIG. 1 may be disposed on a periphery of the display panel DP.

The display panel DP may include a plurality of pixels PX, a plurality of scan lines SL1 to SLm, a plurality of data lines DL1 to DLn, and a plurality of emission lines EL1 to Elm. m and n are natural numbers. The pixels PX may be connected to the scan lines SL1 to SLm, the data lines DL1 to DLn, and the emission lines EL1 to Elm.

The scan lines SL1 to SLm may extend in the first direction DR1 and be connected to the scan driver SDV and the pixels PX. The data lines DL1 to DLn may extend in the second direction DR2 and be connected to the data driver DDV and the pixels PX. The emission lines EL1 to ELm may extend in the first direction DR1 and be connected to the emission driver EDV.

The scan driver SDV may generate a plurality of scan signals and the scan signals may be applied to the pixels PX through the scan lines SL1 to SLm. The scan signals may be sequentially applied to the pixels PX.

The data driver DDV may generate a plurality of data voltages and the data voltages may be applied to the pixels PX through the data lines DL1 to DLn. The emission driver EDV may generate a plurality of light-emitting signals and the light-emitting signals may be applied to the pixels PX through the emission lines EL1 to ELm.

The timing controller TC may control the operation timings of the scan driver SDV, the data driver DDV, and the emission driver EDV. The timing controller TC may respond to a control signal CS received from the outside and generate a scan control signal SCS, a data control signal DCS, and an emission control signal ECS.

The timing controller TC may receive image signals RGB from the outside, and convert the data format of the image signals to conform to the interface specification of the display device DD with the data driver DDV. The timing controller TC may provide the data driver DDV with the converted image signals R'G'B'.

The scan driver SDV may respond to the scan control signal SCS and generate the scan signals. The data driver DDV may receive the converted image signals R'G'B' and respond to the data control signal DCS to generate data voltages corresponding to the converted image signals R'G'B'. The emission driver EDV may respond to the emission control signal ECS to generate emission signals.

A first power supply voltage ELVDD and a second power supply voltage ELVSS may be provided to the pixels PX. The pixels PX may respond to the scan signals and receive the data voltages. The pixels PX may respond to the emission signals and generate light with brightness corresponding to the data voltages to display an image. The light-emitting time of the pixels PX may be controlled by the emission signals.

Each of the pixels PX may express one of the primary colors or one of mixed colors. The primary colors may include red, green, and blue, and the mixed colors may include various colors such as yellow, cyan, magenta, and white. However, the colors displayed by the pixels PX are not limited thereto.

Figure 3:
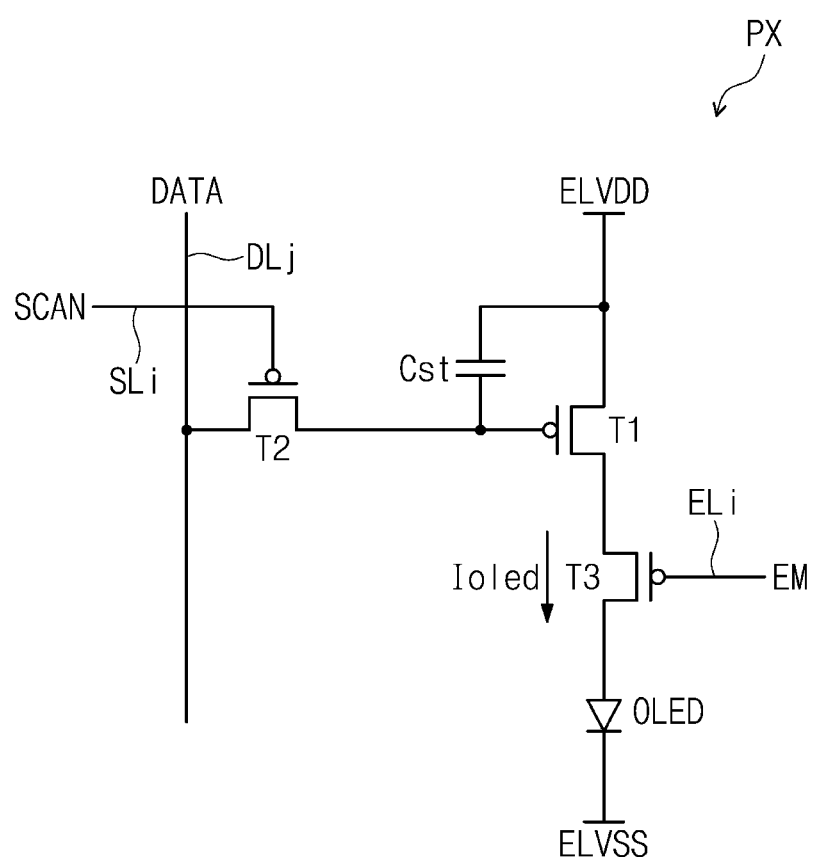
FIG. 3 is an equivalent circuit diagram of a pixel illustrated in FIG. 2.

FIG. 3 is an equivalent circuit diagram of one of the pixels PX illustrated in FIG. 2.

Although FIG. 3 illustrates the configuration of only one pixel PX, all of the pixels PX may have the same configuration as the pixel PX illustrated in FIG. 3.

Referring to FIG. 3, the pixel PX may be connected to a corresponding scan line SLi among the scan lines SL1 to SLm, a corresponding data line DLj among the data lines DL1 to DLn, and a corresponding emission line Eli among the emission lines EL1 to Elm. i is a natural number equal to or smaller than m, and j is a natural number equal to or smaller than n.

The pixel PX may include a light-emitting element OLED, a drive transistor T1, a capacitive element Cst, a switching transistor T2, and an emission control transistor T3. The light-emitting element OLED may be an organic light-emitting diode.

The source terminal of the drive transistor T1 may receive a first power supply voltage ELVDD, and the drain terminal of the drive transistor T1 may be connected to the source terminal of the emission control transistor T3. The gate terminal of the drive transistor T1 may be connected to the drain terminal of the switching transistor T2.

The gate terminal of the switching transistor T2 may be connected to the scan line SLi, and the source terminal of the switching transistor T2 may be connected to the data line DLj. The first electrode of the capacitive element Cst may be connected to the source terminal of the drive transistor T1, and the second electrode of the capacitive element Cst may be connected to the gate terminal of the drive transistor T1.

The gate terminal of the emission control transistor T3 may be connected to the emission line Eli, and the drain terminal of the emission control transistor T3 may be connected the anode electrode of the light-emitting element OLED. The cathode electrode of the light-emitting element OLED may receive a second power supply voltage ELVSS. The second power supply voltage ELVSS may have lower voltage level than the first power supply voltage ELVDD.

The switching transistor T2 may be turned on by responding to a scan signal SCAN received through the scan line SLi. The turned-on switching transistor T2 may provide the gate terminal of the drive transistor T1 with a data voltage DATA received through the data line DLj. The capacitive element Cst may be charged with the data voltage DATA applied to the gate terminal of the drive transistor T1, and may maintain the data voltage after the switching transistor T2 is turned off.

The gate terminal of the emission control transistor T3 may be turned on by responding to an emission signal EM received through the emission line ELi. The turned-on emission control transistor T3 may provide the light-emitting element OLED with current Ioled flowing through the drive transistor T1. The pixel PX may emit light during an application time of the emission signal EM. The light-emitting element OLED may emit light with different light intensities according to the quantity of the provided current Ioled.

For example, the transistors T1 to T3 of the pixel PX may be p-channel metal oxide semiconductor (PMOS) transistors, but the inventive concept is not limited thereto, and the transistors T1 to T3 of the pixel PX may be n-channel metal oxide semiconductor (NMOS) transistors.

Figure 4:
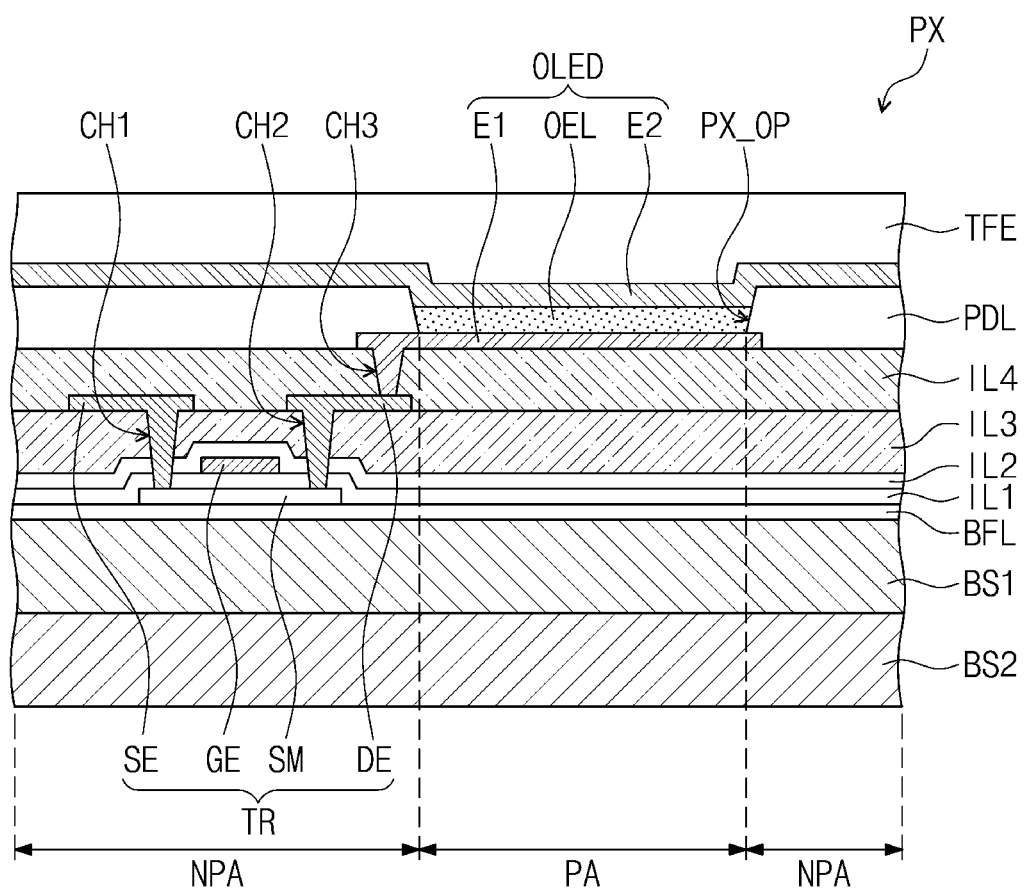
FIG. 4 is a schematic view illustrating a cross-sectional configuration of the pixel illustrated in FIG. 3.

FIG. 4 is a schematic view illustrating a cross-sectional configuration of the pixel PX illustrated in FIG. 3. In FIG. 4, PA refers to a pixel region and NPA refers to a non-pixel region, for example.

Referring to FIG. 4, a pixel PX may include a transistor TR disposed on a first base substrate BS1 and a light-emitting element OLED connected to the transistor TR. The transistor TR may be an emission control transistor T3. The first base substrate BS1 may be a flexible substrate. For example, the first base substrate BS1 may contain polyimide (PI).

A second base substrate BS2 may be disposed under the first base substrate BS1. The second base substrate BS2 may be a protective substrate which protects the lower surface of the first base substrate BS1. The second base substrate BS2 may be a flexible substrate. For example, the second base substrate BS2 may contain polyimide or polyethylene terephthalate (PET).

An inorganic insulating layer may be disposed between the first base substrate BS1 and the second base substrate BS2. For example, the inorganic insulating layer may contain, but is not limited to, silicon nitride, silicon oxynitride, silicon oxide, titanium oxide, or aluminum oxide.

A buffer layer BFL is disposed on the first base substrate BS1, and the buffer layer BFL may include an inorganic material. For example, the buffer layer BFL may contain, but is not limited to, silicon nitride, silicon oxynitride, silicon oxide, titanium oxide, or aluminum oxide.

An inorganic insulating layer may be disposed between the first base substrate BS1 and the buffer layer BFL. For example, the inorganic insulating layer may contain, but is not limited to, silicon nitride, silicon oxynitride, silicon oxide, titanium oxide, or aluminum oxide.

The transistor TR may be disposed on the buffer layer BFL. The transistor TR may include a gate electrode GE, a source electrode SE, a drain electrode DE, and a semiconductor layer SM. The transistor TR may be disposed on layers on which first, second, third and fourth insulating layers IL1, IL2, IL3 and IL4 are disposed.

The semiconductor layer SM may be disposed on the buffer layer BFL. The semiconductor layer SM may include a semiconductor composed of an inorganic material, such as amorphous silicon or polysilicon, or an organic semiconductor. In addition, the semiconductor layer SM may include an oxide semiconductor. The semiconductor layer SM may include a source region, a drain region, and a channel region between the source region and the drain region.

The buffer layer BFL may provide the semiconductor layer SM with a modified surface. In this case, the semiconductor layer SM may have a higher adhesiveness to the buffer layer BFL than when it is directly disposed on the first base substrate BS1. The buffer layer BFL may be a barrier layer which protects the lower surface of the semiconductor layer SM. In this case, the buffer layer BFL may prevent contaminants, moisture, and the like which are introduced into the first and second base substrates BS1 and BS2 or into the semiconductor layer SM through the first and second base substrates BS1 and BS2.

The first insulating layer IL1 may be disposed on the buffer layer BFL to cover the semiconductor SM. The first insulating layer L1 may contain an inorganic material. For example, the first insulating layer IL1 may contain, but is not limited to, silicon nitride, silicon oxynitride, silicon oxide, titanium oxide, or aluminum oxide.

The gate electrode GE overlapping the semiconductor layer SM may be disposed on the first insulating layer IL1. The gate electrode GE may be disposed to overlap the channel region of the semiconductor layer SM. The second insulating layer IL2 may be disposed on the first insulating layer IL1 to cover the gate electrode GE. The second insulating layer IL2 may include an inorganic material. The third insulating layer IL3 may be disposed on the second insulating layer IL2. The third insulating layer IL3 may contain an organic and/or an inorganic material.

The source electrode SE and the drain electrode DE may be disposed on the third insulating layer IL3 and spaced apart from each other. The source electrode SE may be connected to the source region of the semiconductor layer SM through a first contact hole CH1 passing through the first, second and third insulating layers IL1, IL2, and IL3. The drain electrode DE may be connected to the drain region of the semiconductor layer SM through a second contact hole CH2 passing through the first, second and third insulating layers IL1, IL2, and IL3.

The fourth insulating layer IL4 may be disposed on the third insulating layer IL3 to cover the source electrode SE and the drain electrode DE. The fourth insulating layer IL4 may be a flattened film, which provides a flat upper surface, and may contain an organic material.

The organic light-emitting element OLED may include a first electrode E1, an organic light-emitting layer OEL and a second electrode E2. The first electrode E1 may be disposed on the fourth insulating layer IL4. The first electrode E1 may be connected to the drain electrode DE through a third contact hole CH3 passing through the fourth insulating layer IL4.

The first electrode E1 may be a pixel electrode or an anode electrode. The first electrode E1 may be a positive electrode which is a hole injected electrode. The first electrode E1 may include a transparent electrode or a reflective electrode.

A pixel defining layer PDL which exposes a predetermined portion of the first electrode E1 may be disposed on the fourth insulating layer IL4. A pixel opening PX_OP to expose the predetermined portion of the first electrode E1 may be in the pixel defining layer PDL.

The organic light-emitting layer OEL may be disposed on the first electrode E1 inside the pixel opening PX_OP. The organic light-emitting layer OEL may generate light having any one color among red, green or blue. However, the inventive concept is not limited thereto, and the organic light-emitting layer OEL may generate a mixed color by a combination of organic materials which generate red, green, or blue colors.

The second electrode E2 may be disposed on the pixel defining layer PDL and the organic light-emitting layer OEL. The second electrode E2 may be a common electrode or a cathode electrode. The second electrode E2 may be a negative electrode which is an electron injected electrode. The second electrode E2 may include a transparent electrode or a reflective electrode.

When the display panel DP is a top emission-type organic light-emitting display panel, the first electrode E1 may include a reflective electrode, and the second electrode E2 may include a transparent electrode. When the display panel DP is a bottom emission-type organic light-emitting display panel, the first electrode E1 may include a transparent electrode, and the second electrode E2 may include a reflective electrode.

An encapsulation layer TFE may be disposed on the second electrode E2. The encapsulation layer TFE may be a thin film encapsulation layer. The encapsulation layer TFE may include at least two inorganic layers and an organic layer disposed between the two inorganic layers. The inorganic layers may contain an inorganic material and may protect the light-emitting element OLED from moisture/oxygen. The organic layer may contain an organic material and may protect the light-emitting element OLED from foreign substances such as dust particles.

The first power supply voltage ELVDD to allow the organic light-emitting layer OEL to emit light may be applied to the first electrode E1 through the transistor TR, and the second power supply voltage ELVSS may be applied to the second electrode E2. Holes and electrons which are injected into the organic light-emitting layer OEL are coupled, so that excitons may be formed, and while the excitons are transited to a ground state, the light-emitting element OLED may emit light.

Figure 5:
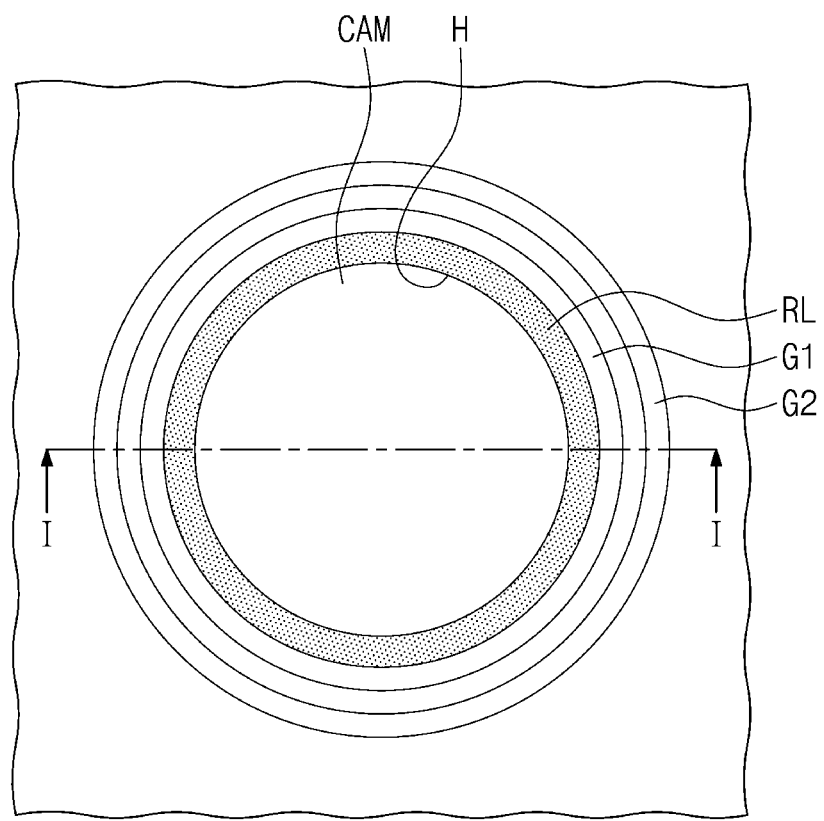
FIG. 5 is an enlarged view of a planar configuration in the vicinity of holes in which a camera illustrated in FIG. 1 is disposed.
Figure 6:
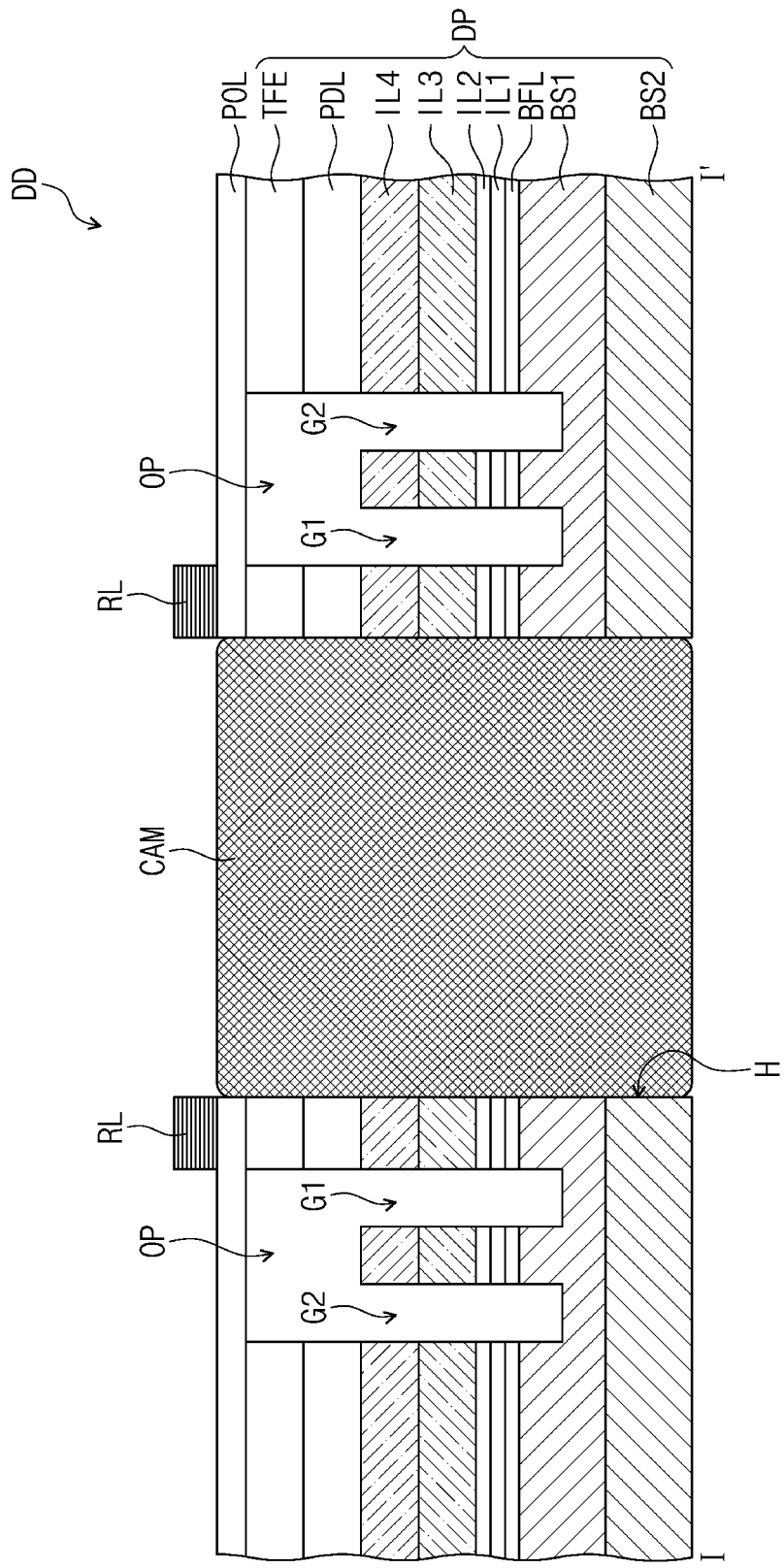
FIG. 6 is a cross-sectional view taken along line I-I' of FIG. 5.

FIG. 5 is an enlarged view of a planar configuration in the vicinity of holes in which the camera CAM illustrated in FIG. 1 is disposed. FIG. 6 is a cross-sectional view taken along line I-I' of FIG. 5.

The configuration in the vicinity of a hole H in which a camera CAM is disposed and the configuration in the vicinity of a hole H in which a speaker SPK is disposed may be substantially the same. Thus, hereinafter referring to FIGS. 5 and 6, just the configuration in the vicinity of the hole H in which the camera CAM is disposed will be described in detail.

Referring to FIGS. 5 and 6, a display device DD may include a polarization film POL disposed on a display panel DP. The display panel DP may include first and second base substrates BS1 and BS2, first to fourth insulating layers IL1 to IL4, a pixel defining layer PDL, and an encapsulation layer TFE. The polarization film POL may be disposed on the encapsulation layer TFE.

The polarization film POL may be adhered to the display panel DP through an adhesive. The adhesive may include an optical clear adhesive. The polarization film POL may be a reflection prevention film.

A touch detection unit may be disposed between the encapsulation layer TFE and the polarization film POL. The touch detection unit may detect an external touch.

The polarization film POL may reduce the reflectivity of external light incident to the display panel DP from above the display panel DP. For example, the polarization film POL may include a retarder and/or a polarizer.

The hole H may pass though the display panel DP and the polarization film POL. The camera CAM may be disposed in the hole H.

In the display panel DP, a plurality of grooves G1 and G2 surrounding the hole H may be provided. The two grooves G1 and G2 are exemplarily shown in the display panel DP, but the number of the grooves G1 and G2 is not limited thereto. For example, a single groove may be provided in the display panel DP, or more than two grooves may be provided in the display panel DP. The polarization film POL may cover the first and second grooves G1 and G2.

The grooves G1 and G2 may include the first groove G1 and the second groove G2 surrounding the first groove G1. The first and second grooves G1 and G2 may pass through the first to fourth insulating layers IL1 to IL4 and a buffer layer BFL and be recessed up to a predetermined depth in the first base substrate BS1.

Pixels PX may be disposed in a region of the display panel DP excluding a region in which the hole H and the first and second grooves G1 and G2 are disposed. For example, the pixels PX may be disposed on the first base substrate BS1 between the second groove G2 and the periphery of the display panel DP.

For example, when viewed in a plan view, the hole H may have a circular shape, and each of the first and second grooves G1 and G2 may have a ring-shape, but the shapes of the hole H and the first and second grooves G1 and G2 are not limited thereto. The term "when viewed in a plan view" may mean a state in which a plane is viewed from above the plane itself. The plane may be defined by first and second directions DR1 and DR2.

An opening OP which overlaps the first groove G1 and the second groove G2 and a region between the first and second grooves G1 and G2 may be provided in the pixel defining layer PDL and the encapsulation layer TFE. The polarization film POL may cover the opening OP. The opening OP and the first and second grooves G1 and G2 may be an integrated space.

A reflective layer RL may be disposed on the polarization film POL between the hole H and the first groove G1. The reflective layer RL may reflect light. For example, the reflective layer RL may reflect a laser having a predetermined wavelength. The wavelength of the laser may be about 355 nm.

The reflective layer RL may include a plurality of layers. A specific configuration of the reflective layer RL will be described in detail below.

The configuration in the vicinity of the hole H, in which the camera CAM is disposed is exemplarily described; however, configurations in the vicinity of each of the holes H in which other functional elements are disposed may be substantially the same as that in the vicinity of the hole H in which the camera CAM is disposed.

Figure 7:
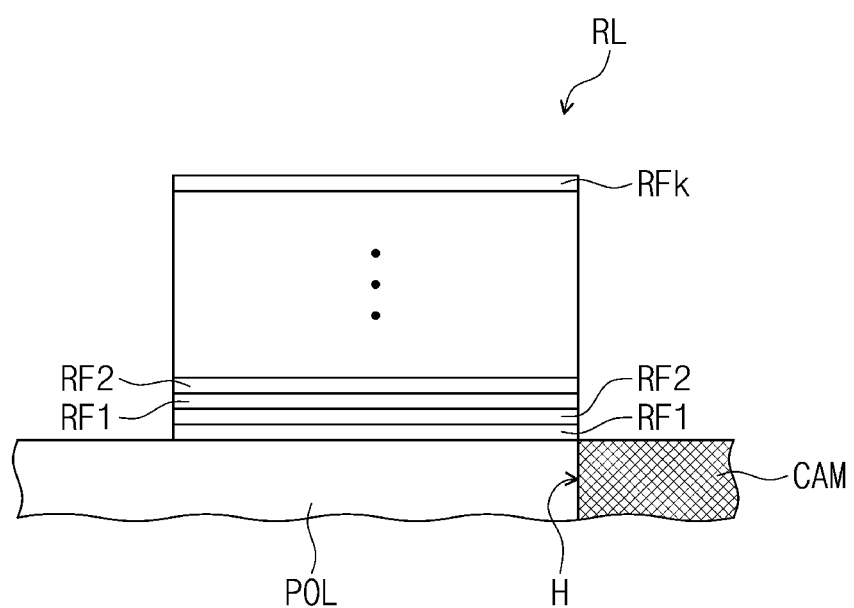
FIG. 7 is a view illustrating a laminated structure of a reflective layer illustrated in FIG. 6.

FIG. 7 is a view illustrating a laminated structure of the reflective layer illustrated in FIG. 6.

Referring to FIG. 7, the reflective layer RL may include a plurality of refractive layers RF1, RF2 and RFk. The refractive layers RF1, RF2 and RFk may be formed by laminating about 13 or more layers, and may be formed by laminating about 13-15 layers, for example. The refractive layers RF1, RF2 and RFk may be inorganic insulating layers containing an inorganic material.

Hereinafter, a thickness may be referred to as the distance between the upper end (or upper surface) and the lower end (or lower surface) of the corresponding configuration. In addition, the thickness may be a numerical value which is measured with respect to a direction perpendicular to the plane defined by first and second directions DR1 and DR2. A width may be the distance between both lateral surfaces of the corresponding configuration, and be a numerical value measured with respect to a horizontal direction.

Each of the refractive layers RF1, RF2 and RFk may have a thickness about 10 nm to about 30 nm. The refractive layers RF1, RF2 and RFk may have at least two refractive indexes different from each other. For example, the refractive layers RF1, RF2 and RFk may include: a plurality of first refractive layers RF1; and a plurality of second refractive layers RF2 having different refractive indexes from the first refractive layers RF1. Each of the second refractive layers RF2 may have a greater refractive index than each of the first refractive layers RF1.

The first refractive layers RF1 and the second refractive layers RF2 may be alternately laminated. For example, the first refractive layers RF1 may be firstly disposed on the polarization film POL, and then, the second refractive layers RF2 and the first refractive layers RF1 may alternately be laminated. However, the inventive concept is not limited thereto, and the second refractive layers RF2 may firstly be disposed on the polarization film POL, and then, the first refractive layers RF1 and the second refractive layers RF2 may alternately be laminated.

When the refractive layers RF1, RF2 and RFk include an odd number of layers, the uppermost refractive layer RFk may be the first refractive layer RF 1. When the refractive layers RF1, RF2 and RFk include an even number of layers, the uppermost refractive layer RFk may be the second refractive layer RF2.

The first refractive layers RF1 and the second refractive layers RF2 may include inorganic materials different from each other. For example, each of the first refractive layers RF1 may include silicone oxide ($SiO_2$). Each of the second refractive layers RF2 may include titanium oxide ($TiO_2$).

When the first and second refractive layers RF1 and RF2 are formed by laminating 13 or more layers, the reflective layer RL may reflect a laser having a predetermined wavelength.

FIGS. 8 to 11 are views for describing a method for manufacturing a display device according to an exemplary embodiment of the inventive concept.

Figure 8:
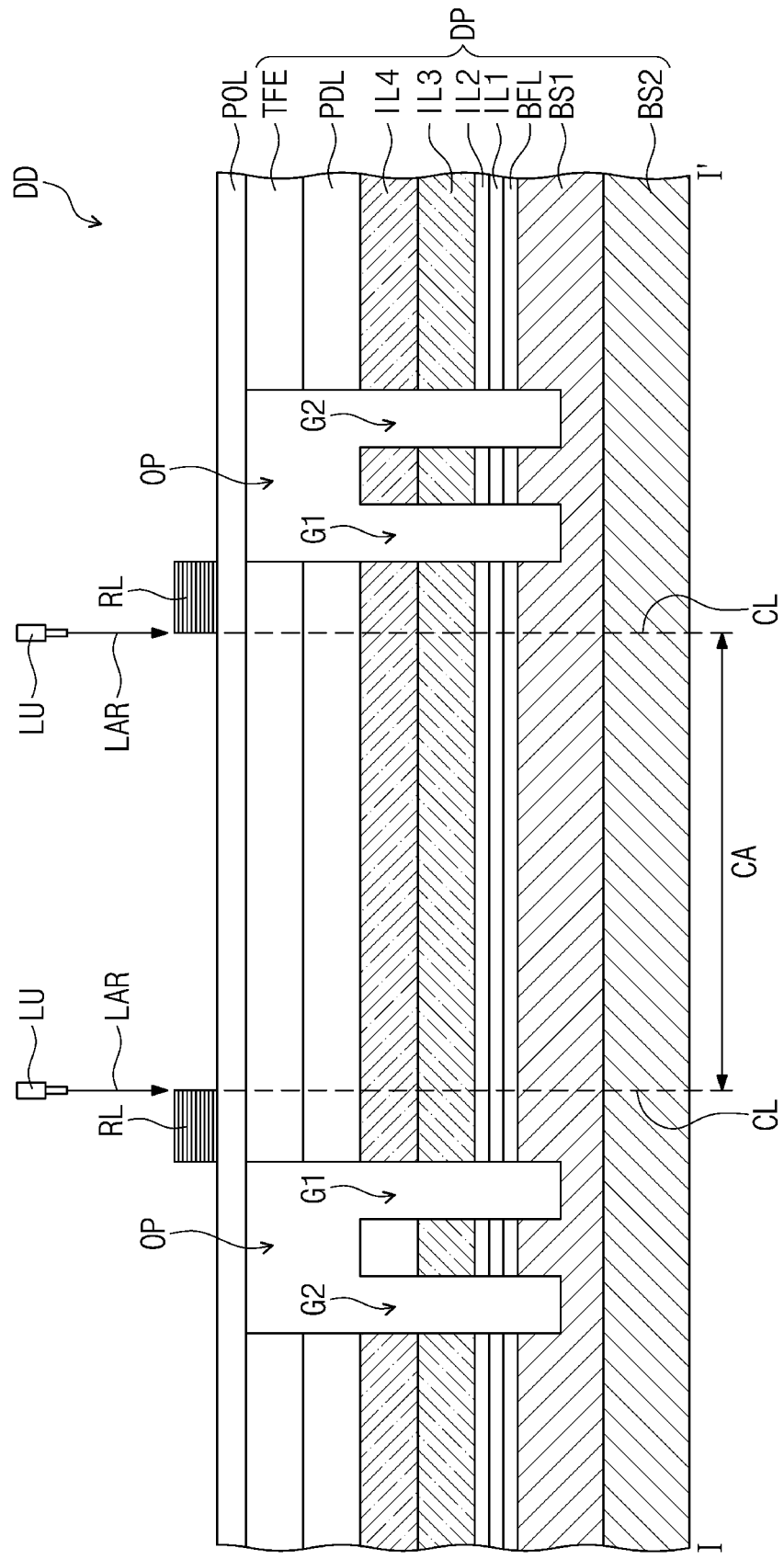
FIGS. 8, 9, 10 and 11 are views for describing a method for manufacturing a display device according to an exemplary embodiment of the inventive concept.
Figure 10:
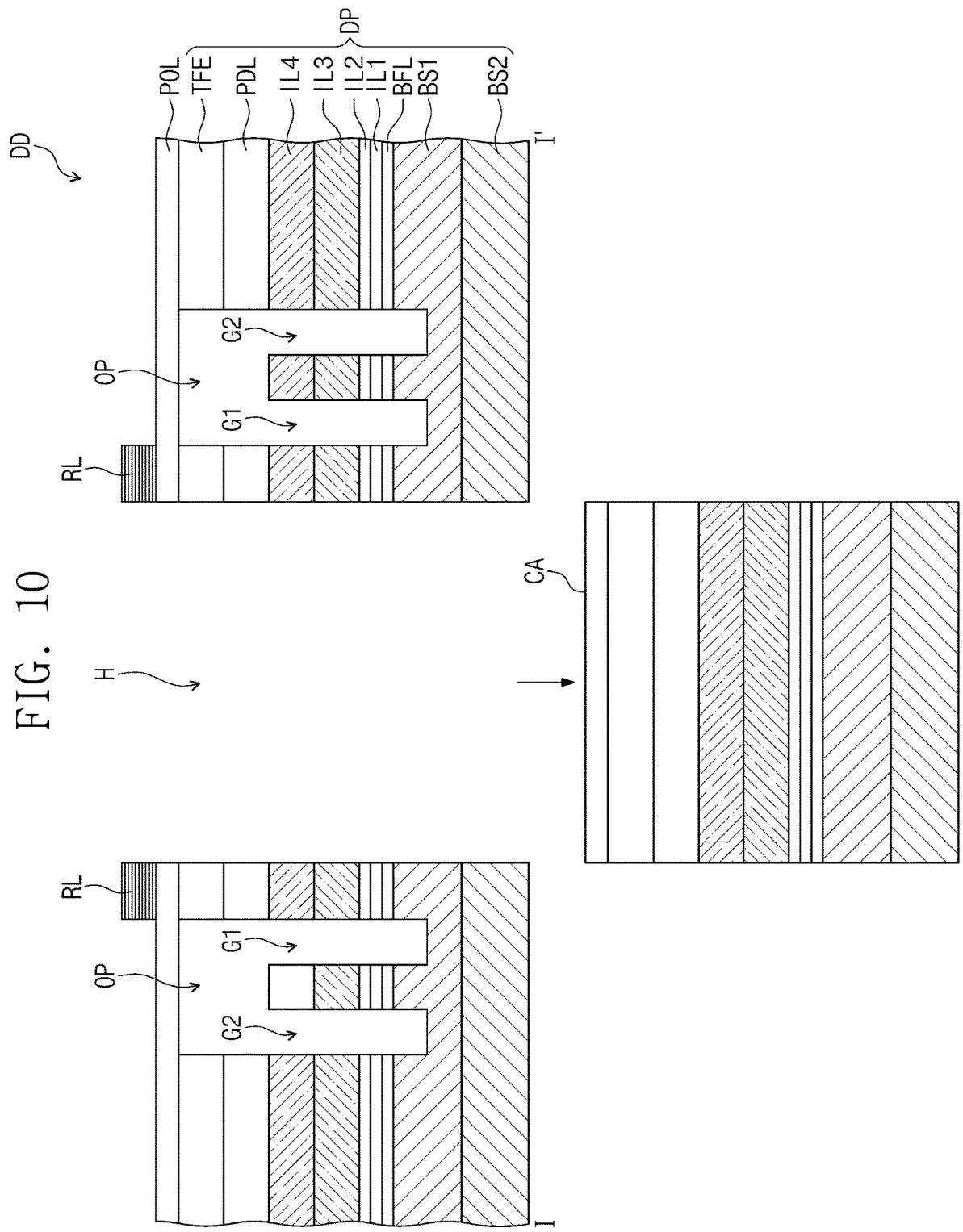
Figure 11:
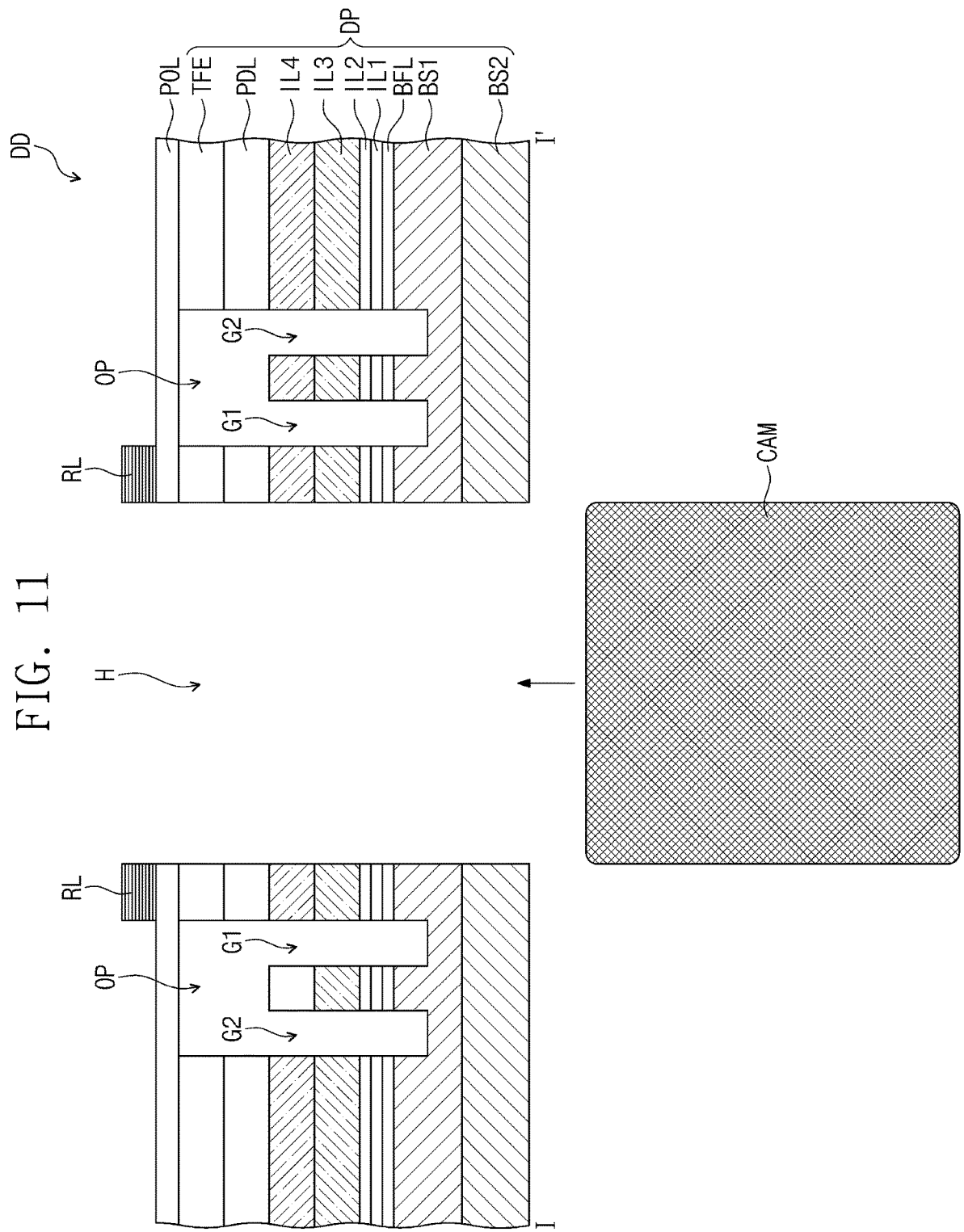

For convenience of description, FIGS. 8, 10, and 11 are illustrated as cross-sectional views corresponding to FIG. 6.

Referring to FIG. 8, a display panel DP including a cut region CA defined by a cut line CL may be prepared. The cut line CL may be a boundary of the hole H illustrated in FIG. 5. Thus, the cut line CL may be a closed curve.

A polarization film POL may be provided on the display panel DP to cover first and second grooves G1 and G2. A reflective layer RL may be disposed on the polarization film POL between the cut line CL and the first groove G1.

A laser unit LU may be disposed above the polarization film POL, and a laser LAR generated by the laser unit LU may be irradiated toward the cut line CL. As described above, the wavelength of the laser LAR may be about 355 nm. The laser LAR may be irradiated to draw a closed curve along the cut line CL.

Figure 9:
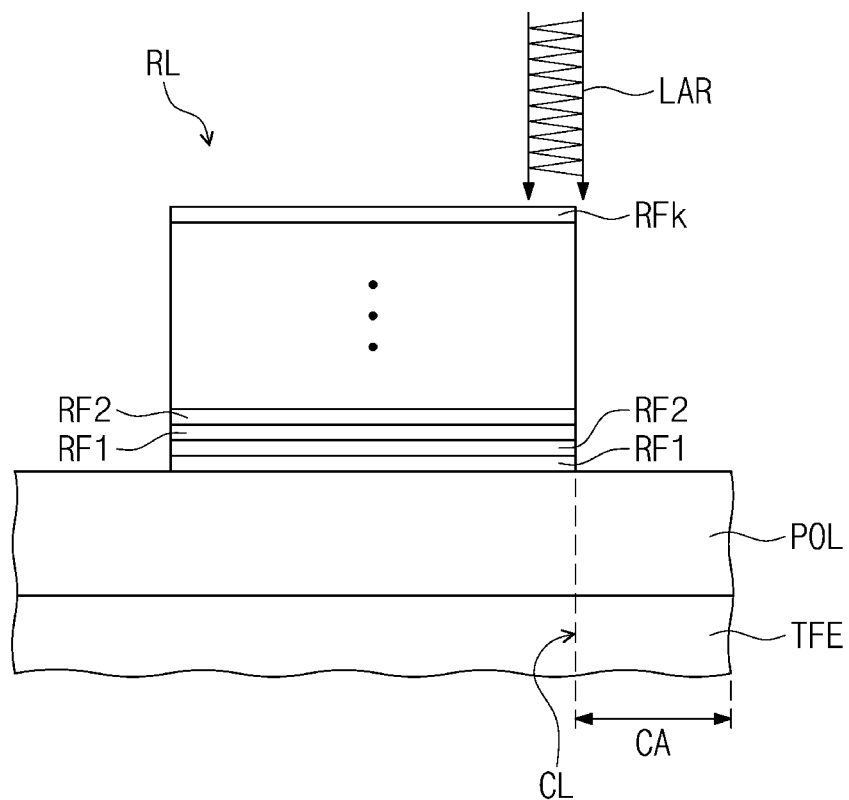

Referring to FIG. 9, the laser LAR may be irradiated to the cut line CL while slightly vibrating. Thus, the laser LAR may not accurately be irradiated to the cut line CL and irradiated up to the vicinity of the cut line CL. For example, as illustrated in FIG. 9, the laser LAR may be irradiated to an outer region of the cut region CA adjacent to the cut line CL. The laser LAR provided to the outer region of the cut region CA may be reflected by a reflective layer RL1.

The laser LAR may also be provided to a portion of the cut region CA adjacent to the cut line CL. However, since the cut region CA is a region to be removed, the yield of the display device DD may not be influenced even though the laser LAR is provided to the cut region CA.

However, when the reflective layer RL is not disposed on the polarization film POL, the laser LAR may be provided to the outside of the cut region CA. Due to such a laser cut tolerance, the cut region CA may not accurately be cut. In addition, a cut surface may not be smooth due to the vibration of the laser LAR.

Since the laser LAR may experience inaccuracies when it is provided to the cut region CA, a sufficient process margin should be ensured in consideration of the laser cut tolerance. The process margin is a space that is provided so that the first and second grooves G1 and G2 do not get irradiated by the laser LAR in the laser cut process. For example, the process margin may correspond to a space between the first groove G1 and the cut line CL. For example, since the laser LAR may not be accurately provided to the cut line CL, the space between the first groove G1 and the cut line CL should be large enough to prevent the first and second grooves G1 and G2 from being hit with the laser LAR.

However, in an exemplary embodiment of the inventive concept, the laser LAR may not be provided to the outside of the cut region CA due to the reflective layer RL, and thus, the laser LAR may be more accurately provided to the cut line CL. In this case, the cut region CA may be more accurately cut and the cut surface may be smoother. Due to the possibility of the laser LAR being provided to the outside of the cut region CA, a sufficient process margin (e.g., space) is typically ensured; however, in accordance with an exemplary embodiment of the inventive concept, such a space is not required, and thus, the process margin may be reduced.

Referring to FIGS. 10 and 11, a laser LAR is irradiated toward a cut line CL, a cut region CA may be cut and the cut region CA may be removed. A hole H may be provided in a display panel DP and a polarization film POL by removing the cut region CA. Since the cut region CA is more accurately cut, the hole H may be more accurately processed. A display device DD may be manufactured with a camera CAM provided in the hole H.

When the cut region CA is cut, external moisture may be introduced into the display panel DP through the hole H and a cut surface. Moisture may be transferred through a pixel defining layer PDL and first to fourth insulating layers IL1 to IL4. However, since first and second grooves G1 and G2 are provided in the vicinity of the hole H, moisture is blocked by the first and second grooves G1 and G2 and may not be provided to the display panel DP on which pixels PX are disposed.

A process for manufacturing the hole H to dispose the camera CAM is exemplarily described, but a process for manufacturing a hole H to dispose a speaker SPK may be the same as the process for manufacturing the hole H to dispose the camera CAM. In addition, processes for manufacturing holes H to dispose other functional elements are substantially the same as the process for manufacturing the hole H to dispose the camera CAM.

Consequently, in a method for manufacturing a display device DD according to an exemplary embodiment of the inventive concept, the holes H to dispose functional elements such as the speaker SPK and the camera CAM are accurately processed, so that a process margin may be reduced.

Figure 12:
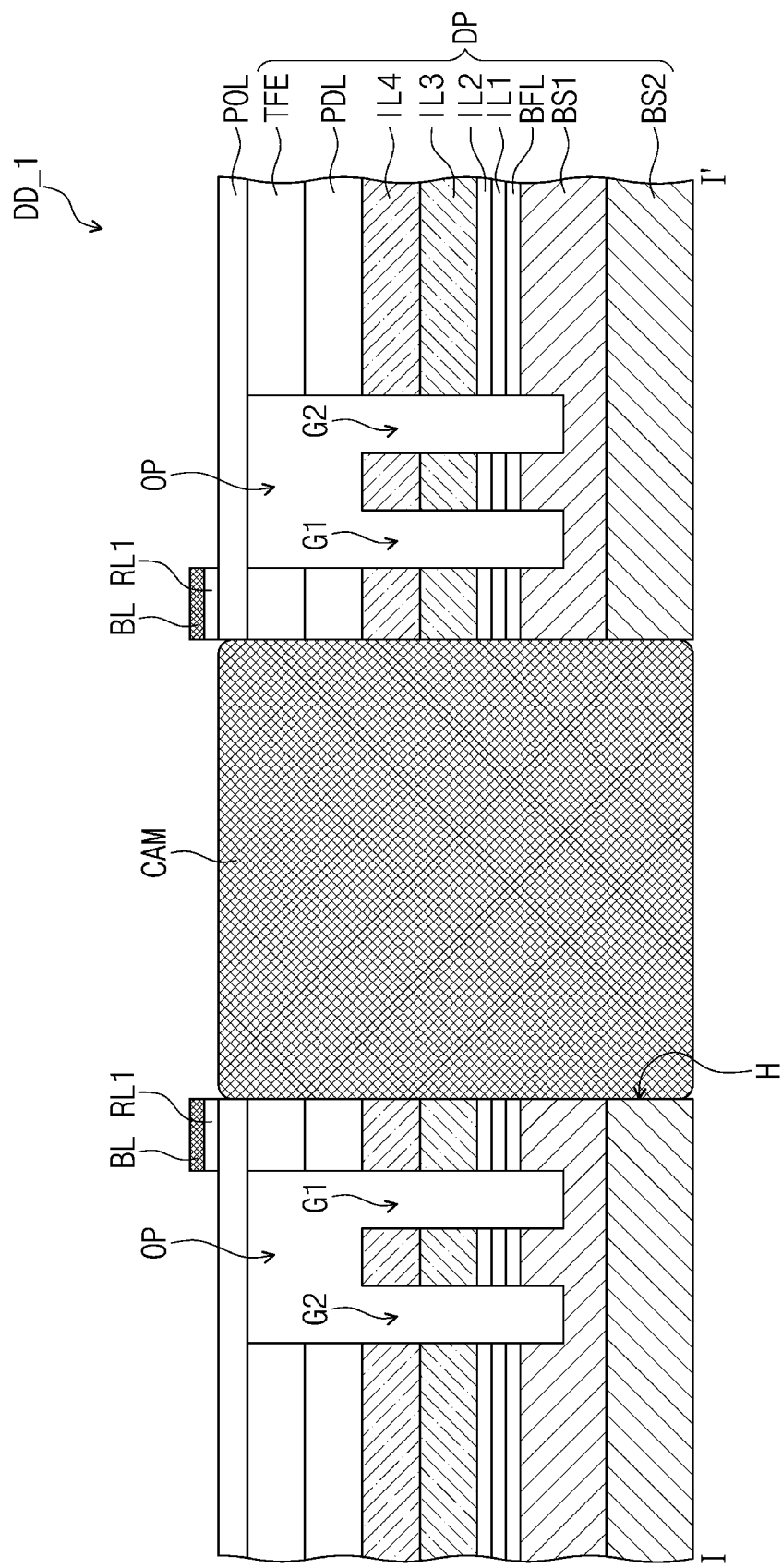
FIG. 12 is a view illustrating a reflective layer of a display device according to another exemplary embodiment of the inventive concept.

FIG. 12 is a view for illustrating a reflective layer of a display device according to another exemplary embodiment of the inventive concept.

Except for a reflective layer RL1, other configurations illustrated in FIG. 12 may be the same as the configuration illustrated in FIG. 6. Thus, hereinafter the configuration of the reflective layer RL1 will mainly be described. For convenience of description, FIG. 12 is illustrated as a cross-sectional surface corresponding to FIG. 6.

Referring to FIG. 12, a display device DD_1 includes a reflective layer RL1, and the reflective layer RL1 may be disposed on a polarization layer POL between a hole H and a first groove G1. The reflective layer RL1 may be disposed on the polarization layer POL as a single layer. The reflective layer RL1 may include a metallic material which reflects light. For example, the reflective layer RL1 may contain a metallic material such as aluminum (Al), copper (Cu), or silver (Ag).

The thickness of the reflective layer RL1 may be at least about 50 nm, for example, about 50 nm to about 1 µm. When the thickness of the reflective layer RL1 is at least 50 nm, the reflective layer RL1 may reflect a laser LAR having a wavelength of about 355 nm. Thus, when a laser LAR is irradiated to a cut line CL to form a hole H, the laser LAR provided to the outside of a cut region CA may be reflected by the reflective layer RL1.

Figure 13:
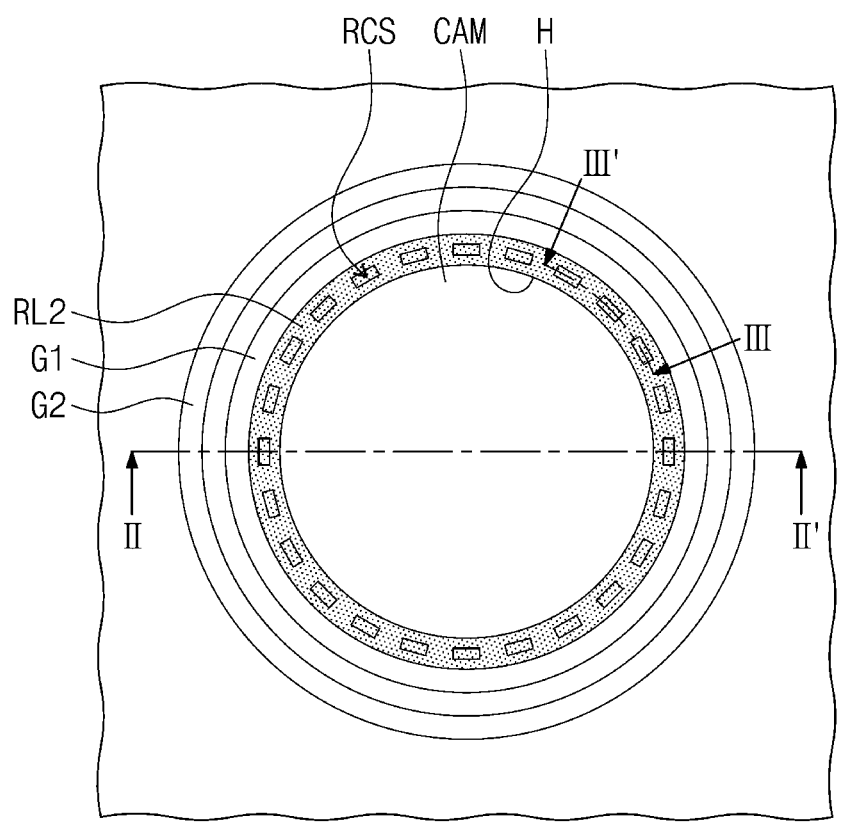
FIG. 13 is a view of a planar configuration of a reflective layer of a display device according to another exemplary embodiment of the inventive concept.
Figure 14:
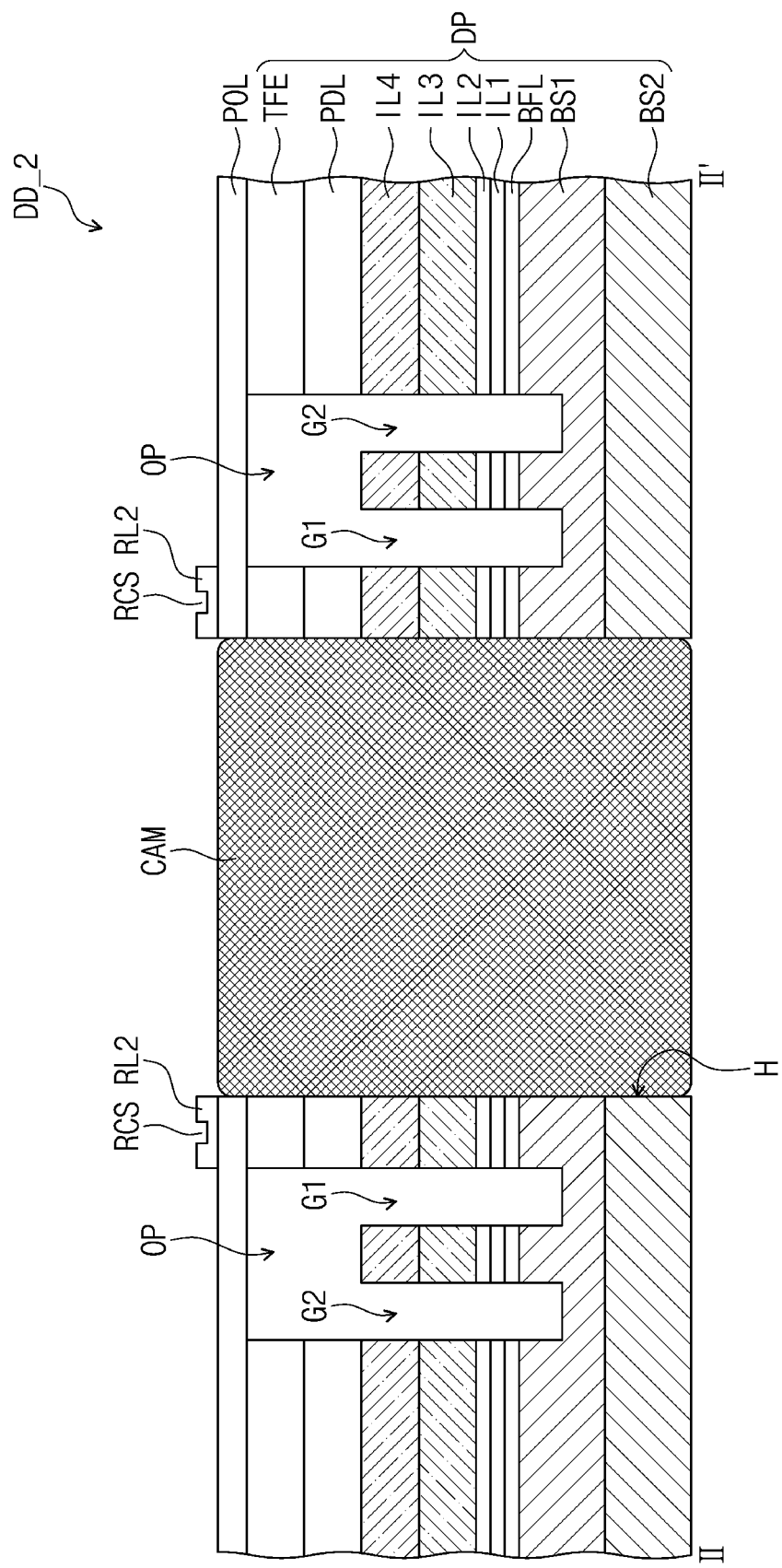
FIG. 14 is a cross-sectional view taken along line II-II' of FIG. 13.
Figure 15:
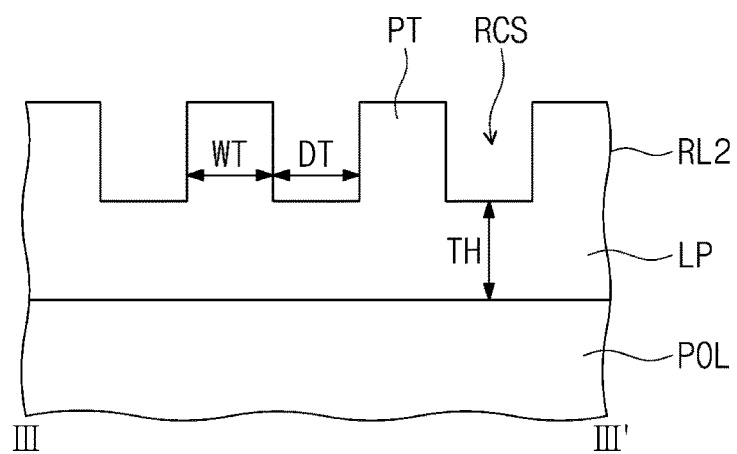
FIG. 15 is a cross-sectional view taken along line III-III' of FIG. 13.

A black layer BL which absorbs light may be disposed on the reflective layer RL1. When the black layer BL is not disposed on the reflective layer RL1, light reflected by the reflective layer RL1 may be viewed by a user. In an exemplary embodiment of the inventive concept, since external light is absorbed by the black layer BL, the reflective layer RL1 may not be viewed. In a manufacturing method according to an exemplary embodiment of the inventive concept, the black layer BL may be provided on the reflective layer RL1 after the hole H is formed by the laser LAR. FIG. 13 is a view of a planar configuration of a reflective layer of a display device according to another exemplary embodiment of the inventive concept. FIG. 14 is a cross-sectional view taken along line 11-11' of FIG. 13. FIG. 15 is a cross-sectional view taken along line III-III' of FIG. 13.

Excluding the configuration of a reflective layer RL2, configurations illustrated in FIGS. 13, 14, and 15 may be the same as the configuration illustrated in FIGS. 5 and 6. Thus, hereinafter the configuration of the reflective layer RL2 will mainly be described. For convenience of description, FIG. 13 is illustrated as a plan view corresponding to FIG. 5, and FIG. 14 is illustrated as a cross-sectional surface corresponding to FIG. 6.

Referring to FIGS. 13 and 14, a display device DD_2 includes a reflective layer RL2, and the reflective layer RL2 may be disposed on a polarization layer POL between a hole H and a first groove G1. The reflective layer RL2 may include a metallic material. A plurality of recess parts RCS may be provided in the reflective layer RL2. The recess parts RCS may be disposed along the boundary of the hole H to surround the hole H. The recess parts RCS may be disposed at regular intervals, but the inventive concept is not limited thereto, and the recess parts RCS may be disposed at irregular intervals.

Referring to FIG. 15, portions of the reflective layer RL2 between the recess parts RCS may be referred to as protruding parts PT, and portions of the reflective layer RL2 under the recess parts RCS may be referred to as a bottom part LP. The protruding parts PT may have rectangular shapes.

The width WT of each of the protruding parts PT may be the same as the distance DT between two adjacent protruding parts PT. For example, the width WT of each of the protruding parts PT may be about 50 nm, and the distance DT between two adjacent protruding parts PT may be about 50 nm. However, the inventive concept is not limited thereto, and the width WT of each of the protruding parts PT may be different from the distance DT between two adjacent protruding parts PT. The thickness TH of the bottom part LP may be larger than about 50 nm, and the reflective layer RL2 including a metallic material may reflect a laser LAR.

After the hole H of FIGS. 13 and 14 is formed by a laser LAR, a black layer BL may be provided on the reflective layer RL2.

Figure 16:
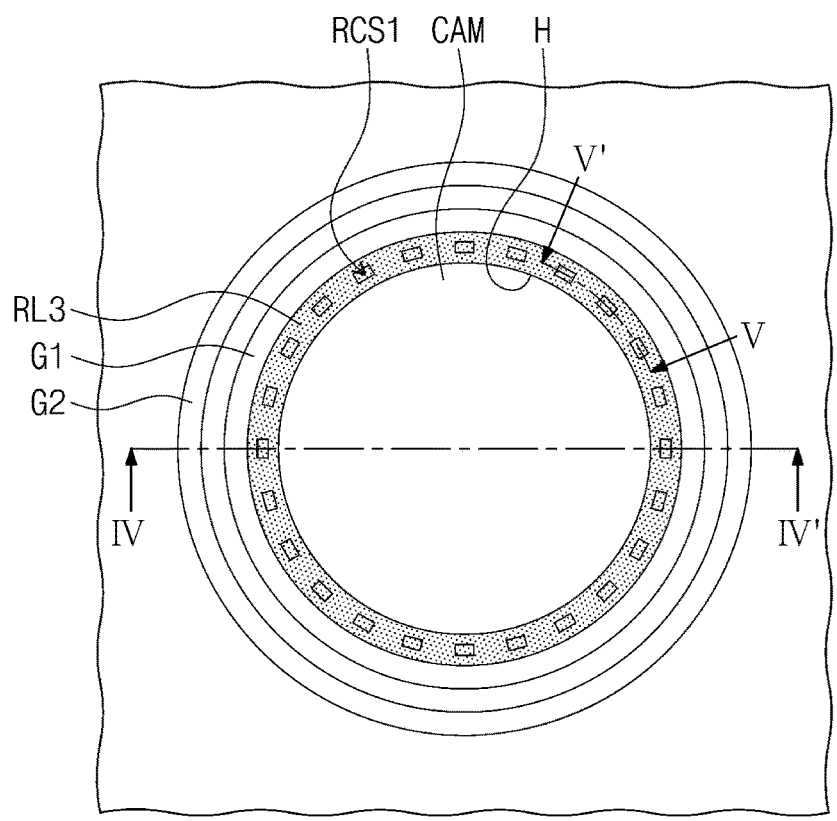
FIG. 16 is a view of a planar configuration in the vicinity of a hole in a display device according to another exemplary embodiment of the inventive concept.
Figure 17:
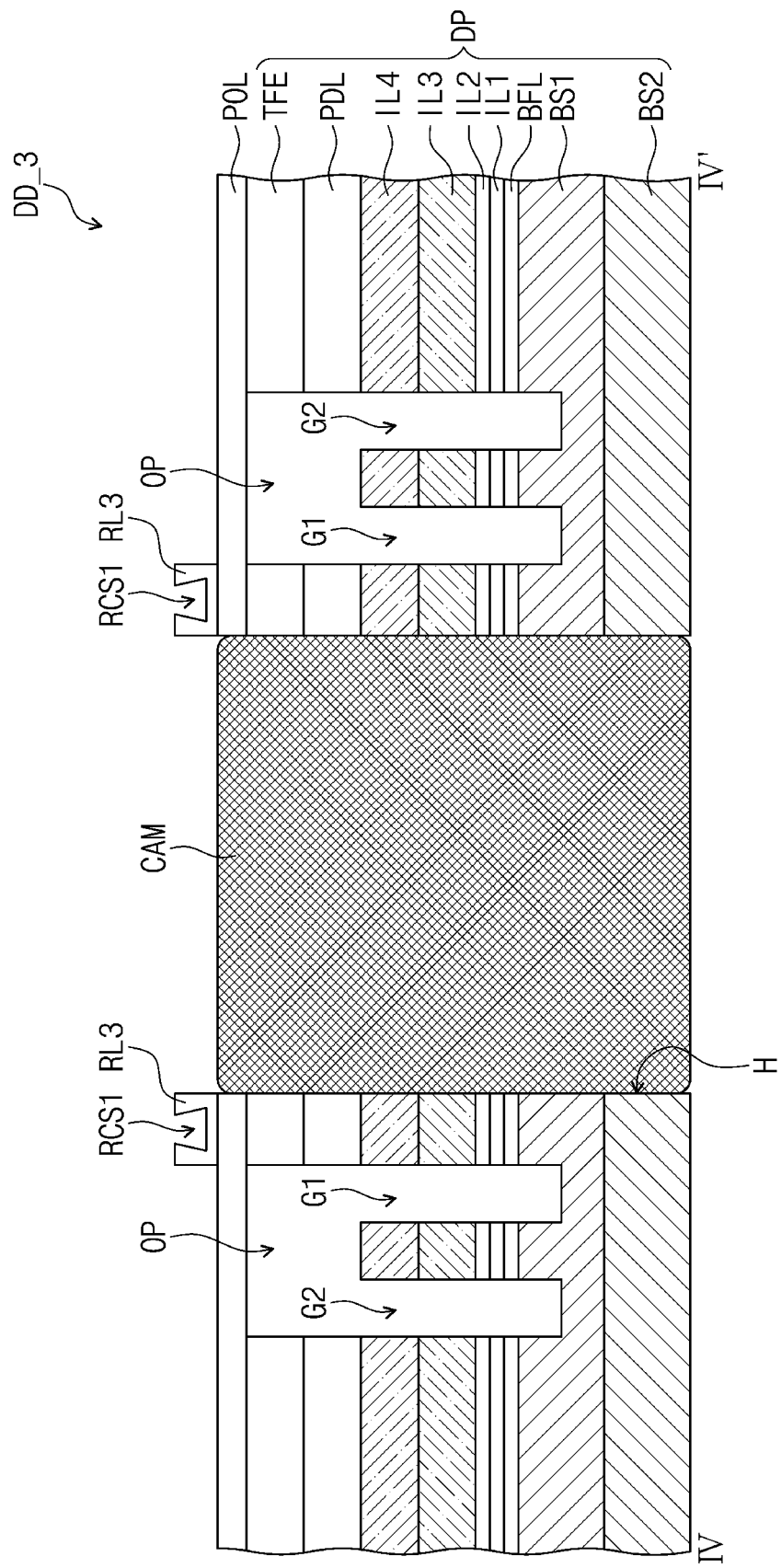
FIG. 17 is a cross-sectional view taken along line IV-IV' of FIG. 16.
Figure 18:
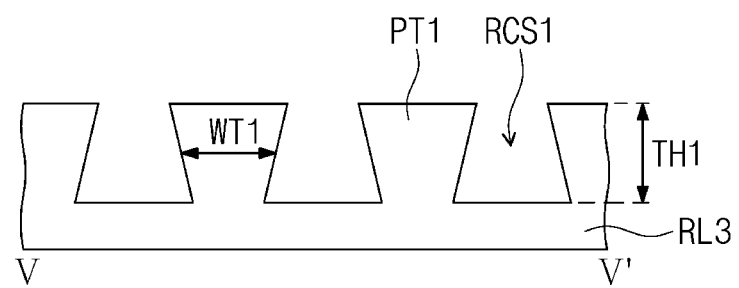
FIG. 18 is a cross-sectional view taken along line V-V' of FIG. 16.
Figure 19:
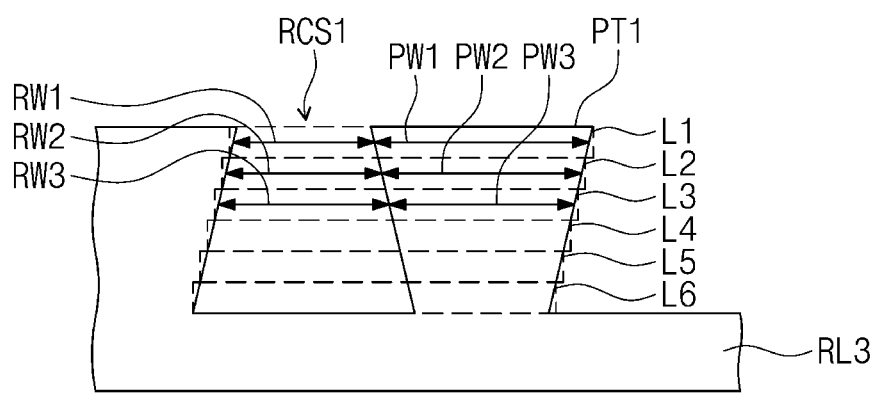
FIG. 19 is a view for describing functions of a recess part and a protruding part illustrated in FIG. 18.

FIG. 16 is a view of a planar configuration in the vicinity of a hole in a display device according to another exemplary embodiment of the inventive concept. FIG. 17 is a cross-sectional view taken along line IV-IV' of FIG. 16. FIG. 18 is a cross-sectional view taken along line V-V' of FIG. 16. FIG. 19 is a view for describing functions of a recess part and a protruding part illustrated in FIG. 18.

Excluding the configuration of a reflective layer RL3, configurations illustrated in FIGS. 16, 17, and 18 may be the same as the configuration illustrated in FIGS. 5 and 6. Thus, hereinafter the configuration of the reflective layer RL3 will mainly be described. For convenience of description, FIG. 16 is illustrated as a plan view corresponding to FIG. 5, and FIG. 17 is illustrated as a cross-sectional surface corresponding to FIG. 6. In addition, FIG. 19 illustrates one recess part RCS1 and one protruding part PT1.

Referring to FIGS. 16 and 17, a display device DD_3 includes a reflective layer RL3, and the reflective layer RL3 may be disposed on a polarization layer POL between a hole H and a first groove G1. The reflective layer RL3 may be an insulating layer. For example, the reflective layer RL3 may be an inorganic insulating layer including an inorganic material. The reflective layer RL3 may be disposed on the polarization layer POL as a single layer.

A plurality of recess parts RCS1 may be provided in the reflective layer RL3, and the recess parts RCS1 may be disposed along the boundary of the hole H to surround the hole H. The recess parts RCS1 may be disposed at regular intervals, but the inventive concept is not limited thereto, and the recess parts RCS1 may be disposed at irregular intervals.

Referring to FIG. 18, the closer to an upper portion of each protruding part PT1, the greater the width WT1 of each of the protruding parts PT1. For example, each of the protruding parts PT1 may have a shape of an inverted trapezoid. The thickness TH1 of each of the protruding parts PT1 may be at least about 100 nm and for example, about 100 nm to about 300 nm.

Referring to FIG. 19, a protruding part PT1 and a recess part RCS1 may be divided into a plurality of layers. The protruding part PT1 and the recess part RCS1 are divided into six layers L1, L2, L3, L4, L5 and L6, but may also be divided into more layers than six. The protruding part PT1 may have a greater refractive index than the recess part RCS1. For example, the recess part RCS1 may be an air layer and have a refractive index of about 1.0, and the protruding part PT1 may be an inorganic material and may have a refractive index of about 1.8.

In the first layer L1, the recess part RCS1 may have a first width RW1, and the protruding part PT1 may have a second width PW1. In the first layer L1, the average refractive index of the recess part RCS1 and the protruding part PT1 may be a first refractive index.

The average refractive index may be a value obtained in such a way that: the product of the area of the recess part RCS1 and the refractive index of the recess part RCS1 and the product of the area of the protruding part PT1 and the refractive index of the protruding part PT1 are added, and the resultant sum is divided by two which is the number of corresponding media (for example, the recess part RCS1 and the protruding part PT1).

In the second layer L2, the recess part RCS1 may have a third width RW2 greater than the first width RW1, and the protruding part PT1 may have a fourth width PW2 smaller than the second width PW1. The width of the protruding part PT1 may be smaller and the width of the recess part RCS1 may be larger in the second layer L2 than in the first layer L1. Since the area of the protruding part PT1, which has a greater refractive index than the recess part RCS1, is reduced in the second layer L2 rather than in the first layer L1, the average refractive index of the recess part RCS1 and the protruding part PT1 may be a second refractive index smaller than the first refractive index in the second layer L2.

In the third layer L3, the recess part RCS1 may have a fifth width RW3 greater than the third width RW2, and the protruding part PT1 may have a sixth width PW3 smaller than the fourth width PW2. The width of the protruding part PT1 may be smaller and the width of the recess part RCS1 may be larger in the third layer L3 than in the second layer L2. Since the area of the protruding part PT1, having a greater refractive index than the recess part RCS1, is reduced in the third layer L3 rather than in the second layer L2, the average refractive index of the recess part RCS1 and the protruding part PT1 may be a third refractive index smaller than the second refractive index in the second layer L2.

According to the areas of the protruding part PT1 and the recess part RCS1, the average refractive index of the fourth layer L4 may be a fourth refractive index smaller than the third refractive index, and the average refractive index of the fifth layer L5 may be a fifth refractive index smaller than the fourth refractive index. In addition, in the sixth layer L6, the average refractive index of the recess part RCS1 and the protruding part PT1 may be a sixth refractive index smaller than the fifth refractive index.

Thus, the six layers L1 to L6 may have refractive indexes different from each other, and the closer to a lower portion of the protruding part PT1 the smaller the refractive index may be. The protruding part PT1 and the recess part RCS1 are illustrated as being divided into the six layers L1 to L6 and the average refractive indexes of the six layers L1 to L6 are described; however, the protruding part PT1 and the recess part RCS1 can be divided into more than six layers, and the average refractive indexes of the more than six layers may be different.

The reflective layer RL3 is a single layer, but may function like the refractive layers having substantially different refractive indexes from each other. When light travels from a high refractive index layer to a low refractive index layer, a portion of light may be reflected at an interface between the low refractive index layer and the high refractive index layer or the light may be totally reflected according to an incident angel. Thus, when a laser LAR travels from the first layer L1 toward the sixth layer L6, the laser LAR may be reflected. Consequently, the reflective layer RL3 may reflect the laser LAR.

A moth-eye structure which can be used for a non-reflective coating technique includes protruding parts protruding upward, and an air layer disposed between the protruding parts. The width of each of the protruding parts of the moth-eye structure may decrease toward the upper portion unlike the protruding part PT1 illustrated in FIG. 19. Thus, in a moth-eye structure unlike the reflective layer RL3, the closer to a lower portion of the moth-eye structure, the greater the average refractive indexes may be.

When light travels from a low refractive index layer to a high refractive index layer, light may not be reflected from an interface between the low refractive index layer and the high refractive index layer but may be refracted and propagate toward the high refractive index layer. Thus, the moth-eye structure may transmit light rather than reflect light, since there is a greater average refractive index closer to its lower portion. The moth-eye structure is a non-reflective structure, accordingly, the reflective layer RL3 of the present embodiment inversely uses the moth-eye structure and may reflect light.

For example, when the thickness of the protruding part PT1 is at least about 100 nm, the laser LAR having a wavelength of about 355 nm may be reflected at the reflective layer RL3. When the laser LAR is irradiated to a cut line CL to form a hole H, the laser LAR provided to the outside of a cut region CA may be reflected from the reflective layer RL3.

Figure 20:
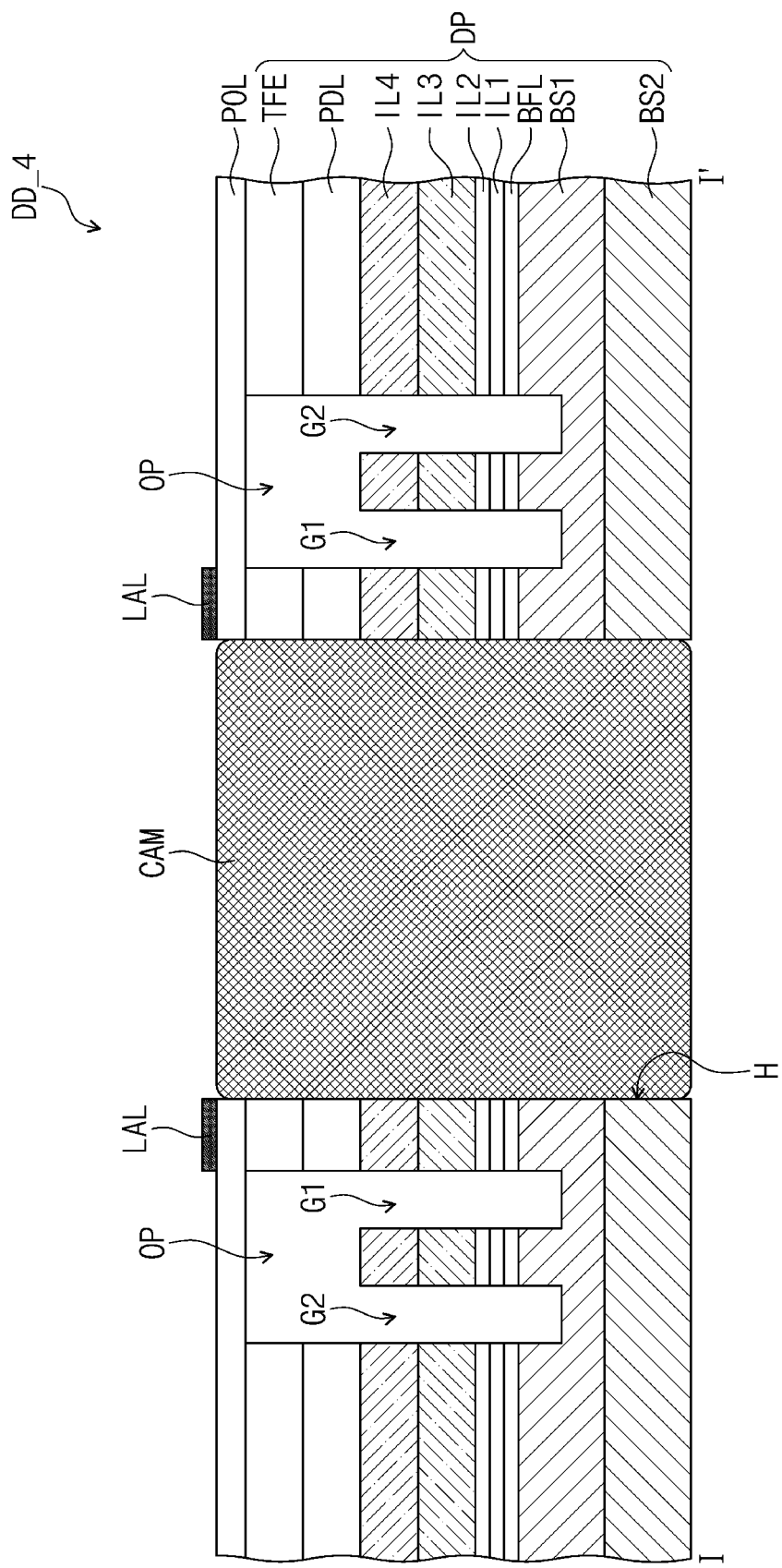
FIG. 20 is a view illustrating a cross-sectional configuration of a display device according to another exemplary embodiment of the inventive concept.

FIG. 20 is a view of a cross-sectional configuration of a display device according to another exemplary embodiment of the inventive concept.

Except for the configuration of a light absorbing layer LAL, configurations illustrated in FIG. 20 are the same as the configurations illustrated in FIG. 6. Thus, hereinafter the configuration of the light absorbing layer LAL will mainly be described. For convenience of description, FIG. 20 is illustrated as a cross-sectional surface corresponding to FIG. 6.

Referring to FIG. 20, a display device DD_4 includes a light absorbing layer LAL, and the light absorbing layer LAL may be disposed on a polarization layer POL between a hole H and a first groove G1. The light absorbing layer LAL may include a material which reflects light. The light absorbing layer LAL may function like the reflective layer RL1. For example, when a laser LAR to form a hole H is irradiated to a cut line CL, the laser LAR provided to the outside of a cut region CA may be absorbed at the light absorbing layer LAL.

Figure 21:
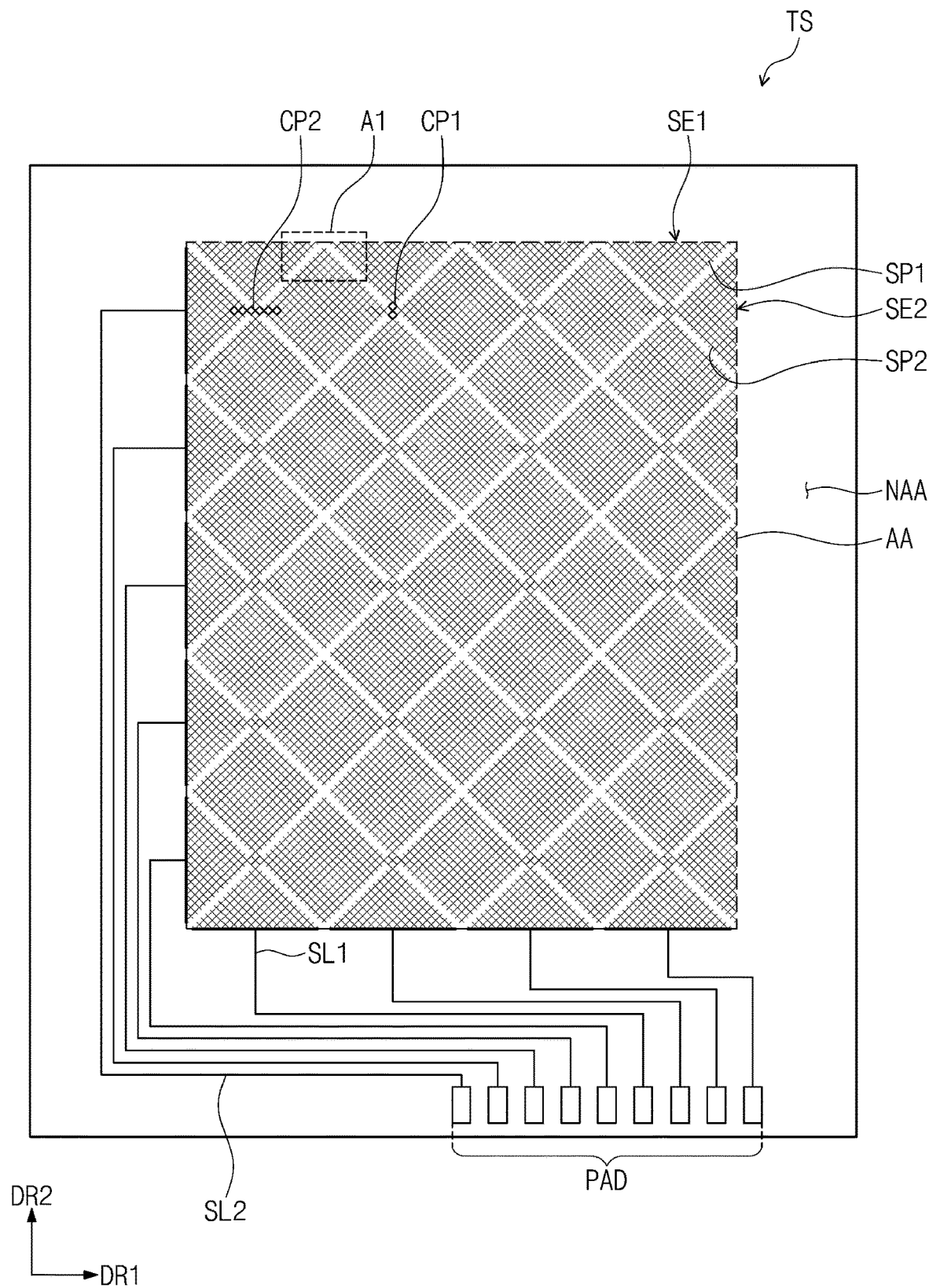
FIG. 21 is a plan view illustrating a touch sensing part of a display device according to another exemplary embodiment of the inventive concept.
Figure 22:
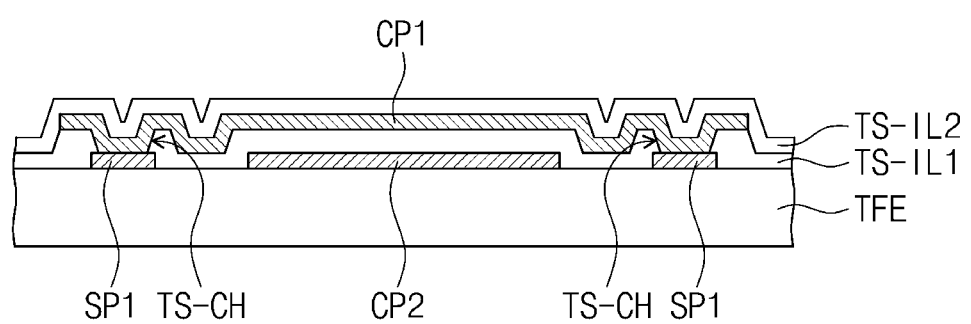
FIG. 22 is a view illustrating a cross-sectional surface of a first connection part which connects first sensor parts illustrated in FIG. 21.
Figure 23:
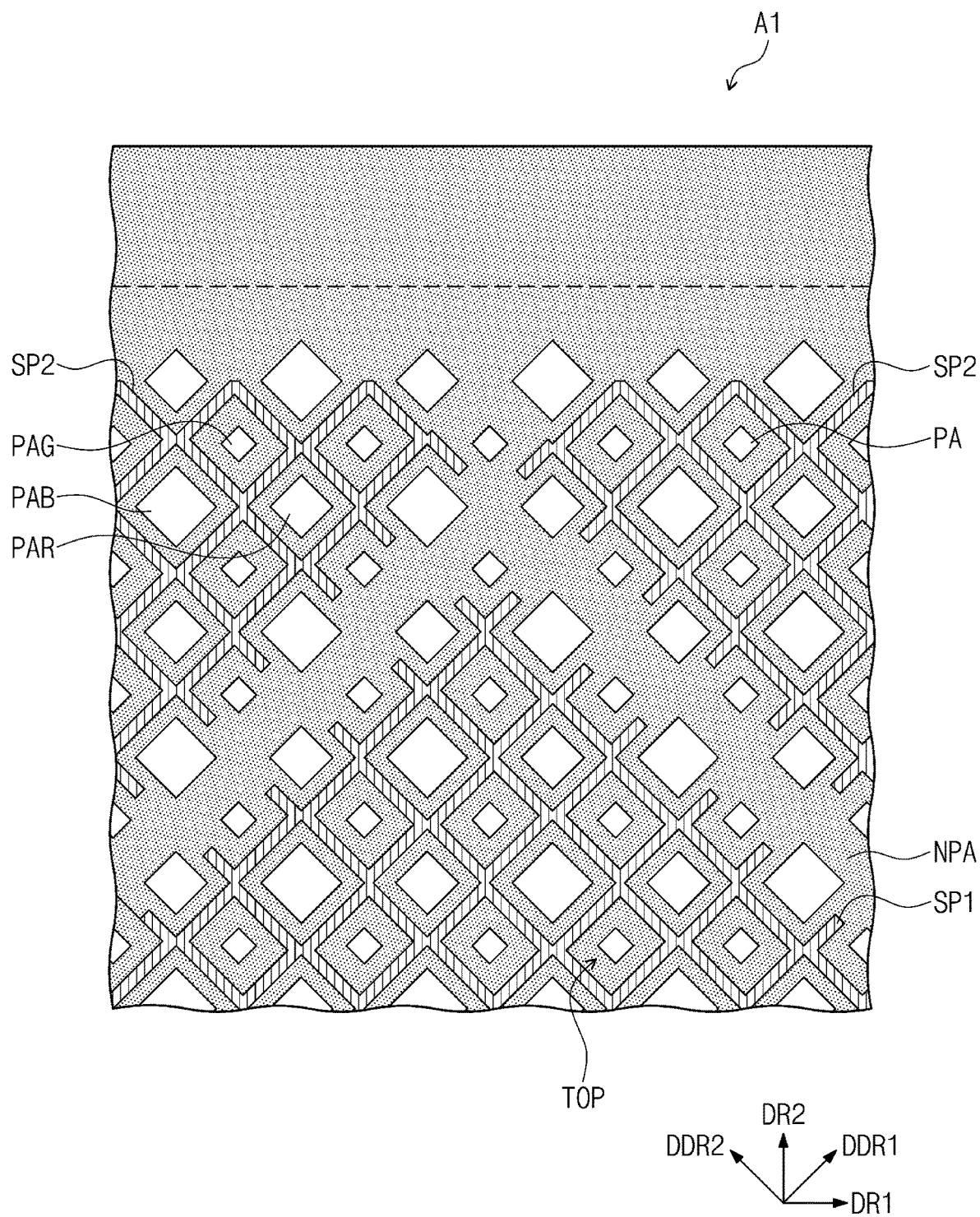
FIG. 23 is an enlarged view of a first region A1 illustrated in FIG. 21.

FIG. 21 is a plan view illustrating a touch sensing part of a display device according to another exemplary embodiment of the inventive concept. FIG. 22 is a view illustrating a cross-sectional surface of a first connection part which connects first sensor parts illustrated in FIG. 21. FIG. 23 is an enlarged view of a first region A1 illustrated in FIG. 21.

Referring to FIG. 21, a touch sensing part TS may include a plurality of detection electrodes SE1 and SE2, a plurality of lines SL1 and SL2, and a plurality of pads PAD. The touch sensing part TS may be disposed on a thin film encapsulation layer TFE. For example, the detection electrodes SE1 and SE2, lines SL1 and SL2, and pads PAD may be disposed on the thin film encapsulation layer TFE. A polarization film POL may be disposed on the touch sensing part TS.

The detection electrodes SE1 and SE2 and the lines SL1 and SL2 may have a single layer structure or an upwardly laminated multilayer structure. A conductive layer with a multilayer structure may include at least two among transparent conductive layers and metal layers. The conductive layer with a multilayer structure may include metal layers containing metals different from each other. The transparent conductive layer may contain indium tin oxide (ITO), indium zinc oxide (IZO), zinc oxide (ZnO), indium tin zinc oxide (ITZO), PEDOT, metal nanowires, graphene, or the like. The metal layer may contain molybdenum, silver, titanium, copper, aluminum, and an alloy thereof.

The touch sensing part TS may include an active region AA and a non-active region NAA surrounding the active region AA. The detection electrodes SE1 and SE2 may be disposed on the active region AA, and the pads PAD may be disposed on the non-active region NAA. The lines SL1 and SL2 may be connected to the detection electrodes SE1 and SE2, extend to the non-active region NAA, and be connected to the pads PAD. The pads PAD may be connected to a drive part to drive the touch sensing part TS through a flexible printed circuit board.

The detection electrodes SE1 and SE2 may include: a plurality of first detection electrodes SE1 extending in a second direction DR2 and arranged in a first direction DR1; and a plurality of second detection electrodes SE2 extending in the first direction DR1 and arranged in the second direction DR2. The lines SL1 and SL2 may include: a plurality of first signal lines SL1 connected to the first detection electrodes SE1; and a plurality of second signal lines SL2 connected to the second detection electrodes SE2.

The first detection electrodes SE1 and the second detection electrodes SE2 may extend to be insulated from and cross each other. The first detection electrodes SE1 and the second detection electrodes SE2 may have mesh shapes. Electrostatic capacitances may be formed by the first detection electrodes SE1 and the second detection electrodes SE2.

Each of the first detection electrodes SE1 may include: a plurality of first sensor parts SP1 arranged in the second direction DR2; and a plurality of first connection parts CP1 which connect the first sensor parts SP1. The first sensor parts SP1 may have mesh shapes. Each of the first connection parts CP1 may be disposed between two adjacent first sensor parts SP1 and electrically connect the two adjacent first sensor parts SP1.

Each of the second detection electrodes SE2 may include: a plurality of second sensor parts SP2 arranged in the first direction DR1; and a plurality of second connection parts CP2 which connect the second sensor parts SP2. The second sensor parts SP2 may have mesh shapes. Each of the second connection parts CP2 may be disposed between two adjacent second sensor parts SP2 and electrically connect the two adjacent second sensor parts SP2.

The first sensor parts SP1 and the second sensor parts SP2 may not overlap each other, may be spaced apart from each other, and may be disposed alternately with each other. The second connection parts CP2 and the first connection parts CP1 may extend to be mutually insulated from and cross each other. The first and second sensor parts SP1 and SP2 and the second connection parts CP2 may be disposed on the same layer. The first connection parts CP1 may be disposed on a layer different from the first and second sensor parts SP1 and SP2 and the second connection parts CP2.

The first and second sensor parts SP1 and SP2 and the second connection parts CP2 may be formed by being simultaneously patterned with a first conductive material. The first connection parts CP1 may be formed by being patterned with a second conductive material.

Referring to FIG. 22, the first sensor parts SP1 and the second connection part CP2 may be disposed on a thin film encapsulation layer TFE. The second sensor parts SP2 may also be disposed on the thin film encapsulation layer TFE. The second sensor parts SP2 and the second connection parts CP2 of the second detection electrode SE2 which are substantially the same may be integrally formed. Thus, the second connection parts CP2 may extend from the second sensor parts SP2.

A first touch insulating layer TS-IL1 may be disposed on the thin film encapsulation layer TFE to cover the first sensor parts SP1 and the second connection part CP2. The first touch insulating layer TS-IL1 may contain an inorganic material. The first connection part CP1 may be disposed on the first touch insulating layer TS-IL1. A second touch insulating layer TS-IL2 may be disposed on the first touch insulating layer TS-IL1 to cover the first connection part CP1.

The first connection part CP1 may be connected to the first sensor parts SP1 through a plurality of contact holes TS-CH in the first touch insulating layer TS-IL1. Both sides of the first connection part CP1 may be connected to the first sensor parts SP1 through the contact holes TS-CH.

The first connection part CP1 may be disposed higher than the first sensor parts SP1 and the second connection part CP2, but the laminated structure is not limited thereto. For example, the first connection part CP1 may be disposed on the thin film encapsulation layer TFE, and the first sensor parts SP1 and the second connection part CP2 may be disposed on the first touch insulating layer TS-IL1.

Referring to FIG. 23, pixels PX may include a plurality of pixel regions PA and a non-pixel region NPA around the pixel regions PA. Each of the pixel regions PA may be the pixel region PA illustrated in FIG. 4. The pixel regions PA may display a red color, a green color, or a blue color. However, the inventive concept is not limited thereto, and the pixel regions PA may further include pixels to display a magenta, cyan, or white color.

The pixel regions PA may have sizes different from each other according to a color to display. For example, a blue pixel region PAB is larger than a red pixel region PAR, and the red pixel region PAR may be larger than a green pixel region PAG.

The pixel regions PA may have diamond shapes, but the inventive concept is not limited thereto, and the pixel regions PA may have various shapes such as circles or polygons. The pixel regions PA may be arranged in a first diagonal direction DDR1 and a second diagonal direction DDR2.

The first diagonal direction DDR1 may be a direction crossing the first and second directions DR1 and DR2 on a plane defined by the first and second directions DR1 and DR2. The second diagonal direction DDR2 may be a direction crossing the first diagonal direction DDR1 on a plane defined by the first and second directions DR1 and DR2. For example, the first direction DR1 and the second direction DR2 may cross each other to be perpendicular to each other, and the first diagonal direction DDR1 and the second diagonal direction DDR2 may cross each other to be perpendicular to each other.

The first and second sensor parts SP1 and SP2 having mesh shapes may overlap the non-pixel region NPA. Openings TOP in the mesh structure may have diamond shapes corresponding to the shapes of the pixel regions PA and sizes corresponding to the pixel regions PA.

The pixel regions PA may be light-emitting regions, and the non-pixel region NPA may be a non-light-emitting region. Since the first and second sensor parts SP1 and SP2 are disposed in the non-pixel region NPA, light generated in the pixel regions PA may be normally emitted without being affected by the first and second sensor parts SP1 and SP2.

Figure 24:
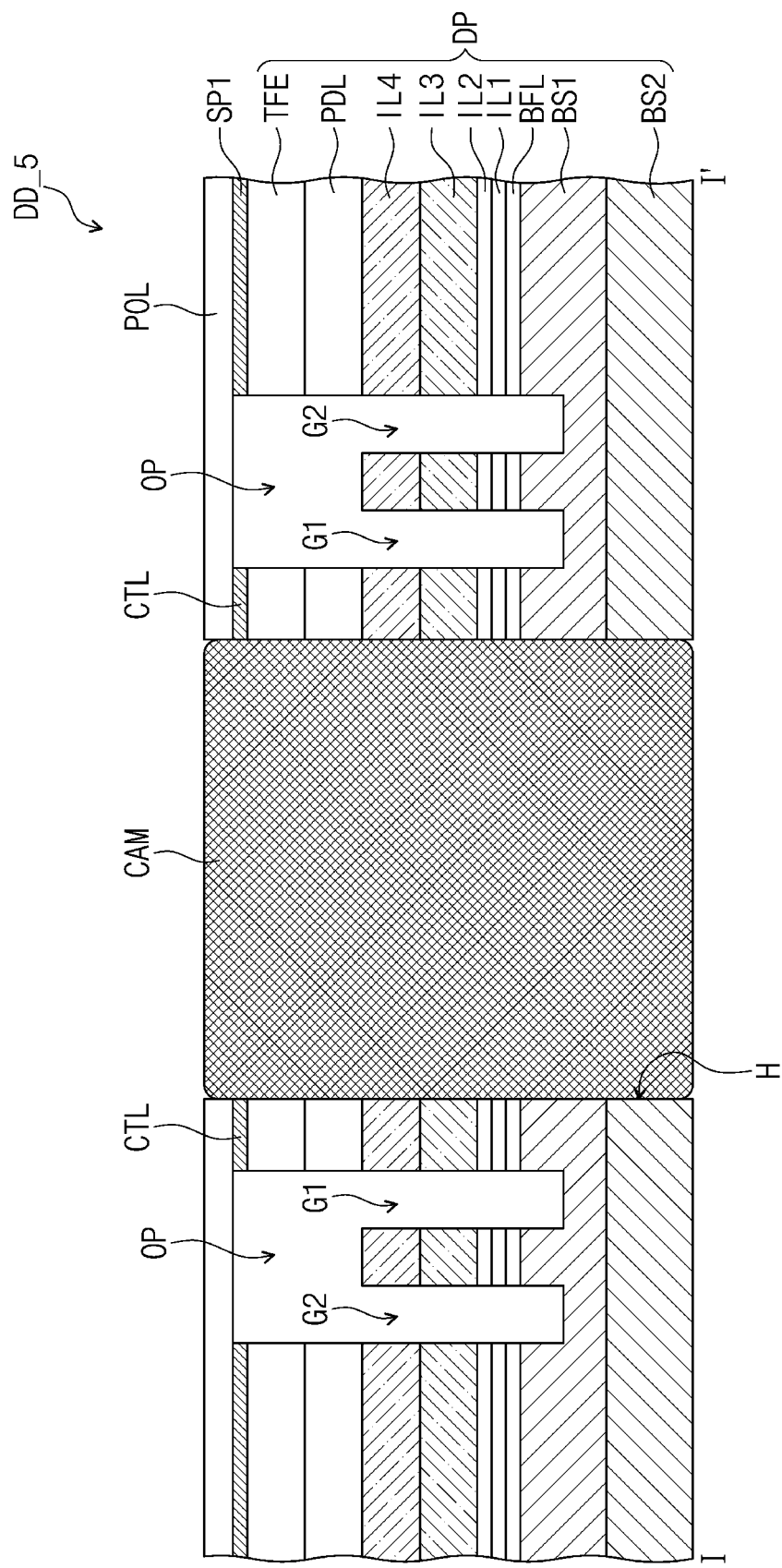
FIG. 24 is a view of a cross-sectional configuration of a display device according to another exemplary embodiment of the inventive concept.

FIG. 24 is a view of a cross-sectional configuration of a display device according to another exemplary embodiment of the inventive concept.

Except for a conductive layer CTL, the configurations illustrated in FIG. 24 may be the same as the configuration illustrated in FIG. 6. Thus, hereinafter the configuration of the conductive layer CTL will mainly be described. For convenience of description, FIG. 24 is illustrated as a cross-sectional surface corresponding to FIG. 6.

Referring to FIG. 24, a display device DD_5 may include a conductive layer CTL, and the conductive layer CTL may be disposed between a hole H and a first groove G1. The conductive layer CTL may be disposed between a thin film encapsulation layer TFE and a polarization film POL. The conductive layer CTL may be formed by being simultaneously patterned with the same material as the first sensor part SP1 and the second sensor part SP2 which are disposed between the thin film encapsulation layer TFE and the polarization film POL. For example, the conductive layer CTL may include a metal which forms the first and second sensor parts SP1 and SP2 and may reflect light. Thus, a laser LAR may be reflected at the conductive layer CTL.

Any one among the reflective layers RL, RL1, RL2, and RL3 which are described above or the light absorbing layer LAL may further be disposed on the polarization film POL.

Figure 25:
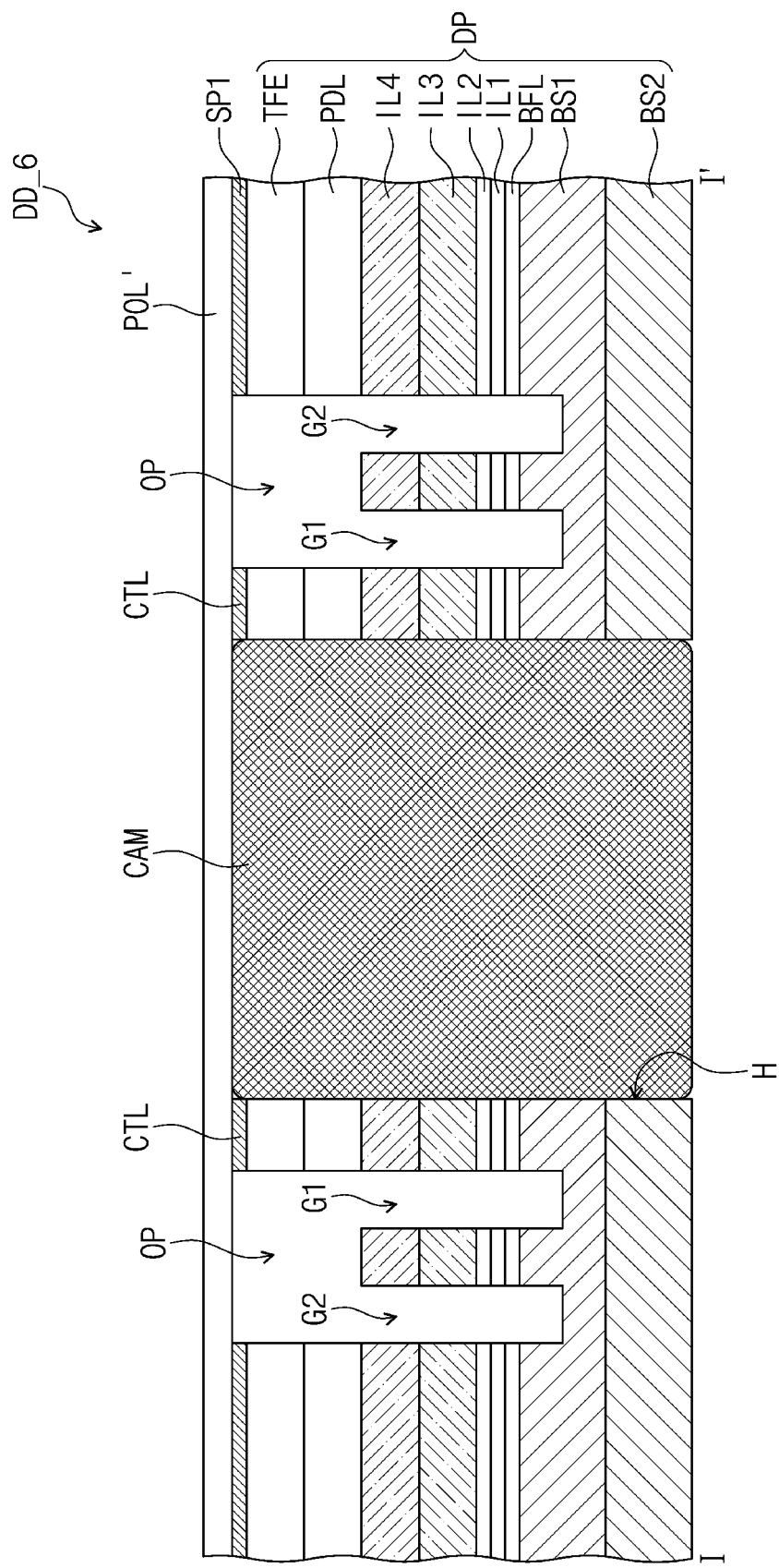
FIG. 25 is a view of a cross-sectional configuration of a display device according to another exemplary embodiment of the inventive concept.

FIG. 25 is a view for illustrating a cross-sectional configuration of a display device according to another exemplary embodiment of the inventive concept.

Referring to FIG. 25, a display device DD_6 may include a conductive layer CTL, and the conductive layer CTL may be disposed between a hole H and a first groove G1. The conductive layer CTL may substantially be the same as the conductive layer CTL illustrated in FIG. 24. In FIG. 25, the hole H may not be formed in a polarization film POL'. Other configurations of the display device DD_6 may be the same as the display device DD_5 illustrated in FIG. 24.

A display device and a method for manufacturing the same according to an exemplary embodiment of the inventive concept may reduce a process margin by accurately processing holes to dispose functional elements.

While the inventive concept has been shown and described with reference to exemplary embodiments thereof, a person skilled in the art will understand that many modifications and variations may be made thereto without departing from the spirit and scope of the inventive concept as defined in the following claims.

What is claimed is:

1. A display device, comprising:
    a display panel;
    a polarization film disposed on the display panel; and
    a reflective layer disposed on the polarization film, wherein a first side of the reflective layer forms a sidewall of a first hole and a second side of the reflective layer opposite the first side of the reflective layer is adjacent to a first groove, wherein the first hole passes through the display panel and the polarization film, and the first groove is provided in the display panel around the first hole.

2. The display device of claim 1, wherein the polarization film covers the first groove.

3. The display device of claim 1, wherein the reflective layer reflects a laser.

4. The display device of claim 3, wherein a wavelength of the laser is about 355 nm.

5. The display device of claim 1, wherein the reflective layer comprises a plurality of refractive layers having at least two refractive indexes different from each other.

6. The display device of claim 5, wherein the refractive layers include about 13 to about 15 layers.

7. The display device of claim 5, wherein each of the refractive layers has a thickness of about 10 nm to about 30 mil.

8. The display device of claim 5, wherein the refractive layers comprise:
    a plurality of first refractive layers; and
    a plurality of second refractive layers having greater refractive indexes than the first refractive layers,
    wherein the first refractive layers are alternately laminated with the second refractive layers.

9. The display device of claim 8, wherein the first refractive layers and the second refractive layers comprise inorganic materials different from each other.

10. The display device of claim 1, further comprising a second hole.

11. The display device of claim 10, wherein the display panel comprises a display region and the first and second holes are provided in the display region.

12. The display device of claim 1, further comprising a functional element disposed in the first hole.

13. The display device of claim 1, further comprising a second groove.

14. The display device of claim 13, wherein the second groove is disposed around the first groove, and
    wherein the reflective layer is disposed on the polarization layer between the first hole and the first groove.

15. The display device of claim 14, wherein the display panel comprises:
    a base substrate;
    a plurality of insulating layers disposed on the base substrate;
    a pixel defining layer disposed on the insulating layers;
    an encapsulation layer disposed on the pixel defining layer; and
    a plurality of pixels disposed on the base substrate between the second groove and a periphery of the display panel,
    wherein the first groove and the second groove pass through the insulating layers and are recessed into the base substrate, and the polarization film is disposed on the encapsulation layer.

16. The display device of claim 15, wherein an opening overlapping the first groove, the second groove, and a region between the first groove and the second groove is provided in the pixel defining layer and the encapsulation layer, and the polarization film covers the opening.

17. The display device of claim 15, wherein at least one of the pixels comprises:
    a transistor disposed on the base substrate; and
    a light-emitting element connected to the transistor,
    wherein the transistor is disposed in the insulating layers, and the light-emitting element is disposed in a pixel opening in the pixel defining layer.

18. The display device of claim 1, wherein the reflective layer comprises a metallic material.

19. The display device of claim 18, wherein a thickness of the reflective layer is about 50 nm to about 1 µm.

20. The display device of claim 18, wherein a plurality of recess parts is disposed on the reflective layer along a boundary of the first hole, and
   a cross-sectional surface of each of a plurality of protruding parts between the recess parts has a rectangular shape.

21. The display device of claim 1, wherein the reflective layer comprises an insulating layer in which a plurality of recess parts are disposed along a boundary of the first hole.

22. The display device of claim 21, wherein each of protruding parts between the recess parts has a width increasing toward an upper portion of the protruding part.

23. The display device of claim 22, wherein a thickness of each of the protruding parts is about 100 nm to about 300 nm.

24. A display device, comprising:
   a display panel;
   a polarization film disposed on the display panel;
   a functional element disposed in a hole formed in the display panel and the polarization film; and
   a reflective layer disposed on the polarization film,
   wherein the reflective layer is disposed between the functional element and a groove formed in the display panel,
   wherein the reflective layer does not overlap the hole and the groove.

25. The display device of claim 24, wherein the functional element includes a camera, a speaker or a light source.

26. The display device of claim 24, Wherein the reflective layer surrounds the functional element.

* * * * *